US008232555B2

(12) United States Patent
Noda et al.

(10) Patent No.: US 8,232,555 B2
(45) Date of Patent: Jul. 31, 2012

(54) SEMICONDUCTOR DEVICE, AND METHOD FOR MANUFACTURING THEREOF

(75) Inventors: Yumiko Noda, Atsugi (JP); Yasuyuki Arai, Atsugi (JP); Yasuko Watanabe, Yokohoma (JP); Yoshitaka Moriya, Atusgi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1180 days.

(21) Appl. No.: 11/795,859

(22) PCT Filed: Jan. 26, 2006

(86) PCT No.: PCT/JP2006/301708
§ 371 (c)(1),
(2), (4) Date: Jul. 24, 2007

(87) PCT Pub. No.: WO2006/080552
PCT Pub. Date: Aug. 3, 2006

(65) Prior Publication Data
US 2008/0135627 A1 Jun. 12, 2008

(30) Foreign Application Priority Data
Jan. 31, 2005 (JP) .................... 2005-024583

(51) Int. Cl.
*H01L 29/15* (2006.01)
(52) U.S. Cl. ...... 257/72; 257/679; 257/758; 257/E23.01
(58) Field of Classification Search .................... 257/72, 257/679, 758, E23.01
See application file for complete search history.

(56) References Cited

U.S. PATENT DOCUMENTS 6,692,984 B2 2/2004 Yonezawa et al.
6,795,339 B2 9/2004 Ooishi
(Continued)

FOREIGN PATENT DOCUMENTS
EP 1 453 088 9/2004
(Continued)

OTHER PUBLICATIONS

International Search Report (Application No. PCT/JP2006/301708) dated May 16, 2006.
(Continued)

*Primary Examiner* — Matthew E Warren
(74) *Attorney, Agent, or Firm* — Eric J. Robinson; Robinson Intellectual Property Law Office, P.C.

(57) ABSTRACT

It is an object of the present invention to provide a device suitable for new usage by making use of a semiconductor device such as an RFID tag in terms of the capability to transmit and receive data without being contacted therewith, to decrease a burden on a user, and to improve convenience. A semiconductor device is provided to have an arithmetic processing circuit including a transistor, a conductive layer serving as an antenna, a detecting unit having a means for detecting physical quantity or chemical quantity, and a storage unit for storing data detected by the detecting unit, and to cover the arithmetic processing circuit, the conductive layer, the detecting unit, and the storage unit with a protective layer. In addition, diverse information can be monitored and controlled by providing such a semiconductor device for human beings, animals and plants, or the like without being contacted therewith.

17 Claims, 15 Drawing Sheets

U.S. PATENT DOCUMENTS

| | | |
|---|---|---|
| 6,825,492 B2 | 11/2004 | Yonezawa et al. |
| 6,847,047 B2 | 1/2005 | VanBuskirk et al. |
| 6,943,370 B2 | 9/2005 | VanBuskirk et al. |
| 7,157,050 B2 * | 1/2007 | Yazawa et al. ............... 422/68.1 |
| 7,405,665 B2 * | 7/2008 | Yamazaki ................... 340/572.8 |
| 2003/0191693 A1 | 10/2003 | Aphek |
| 2004/0084743 A1 | 5/2004 | Van Buskirk et al. |
| 2004/0164302 A1 | 8/2004 | Arai et al. |
| 2005/0093037 A1 | 5/2005 | Yonezawa et al. |
| 2006/0141474 A1 * | 6/2006 | Miyahara et al. ................. 435/6 |

FOREIGN PATENT DOCUMENTS

| | | |
|---|---|---|
| JP | 2000-105807 | 4/2000 |
| JP | 2001-014504 | 1/2001 |
| JP | 2001-260580 A | 9/2001 |
| JP | 2002-277323 | 9/2002 |
| JP | 2002-305296 | 10/2002 |
| JP | 2003-243631 | 8/2003 |
| JP | 2003-303379 A | 10/2003 |
| JP | 2004-147845 | 5/2004 |
| JP | 2004-282050 | 10/2004 |
| JP | 2004-359363 A | 12/2004 |
| JP | 2006-505939 | 2/2006 |
| WO | 2004/042738 | 5/2004 |

OTHER PUBLICATIONS

Written Opinion (Application No. PCT/JP2006/301708) dated May 16, 2006.

* cited by examiner

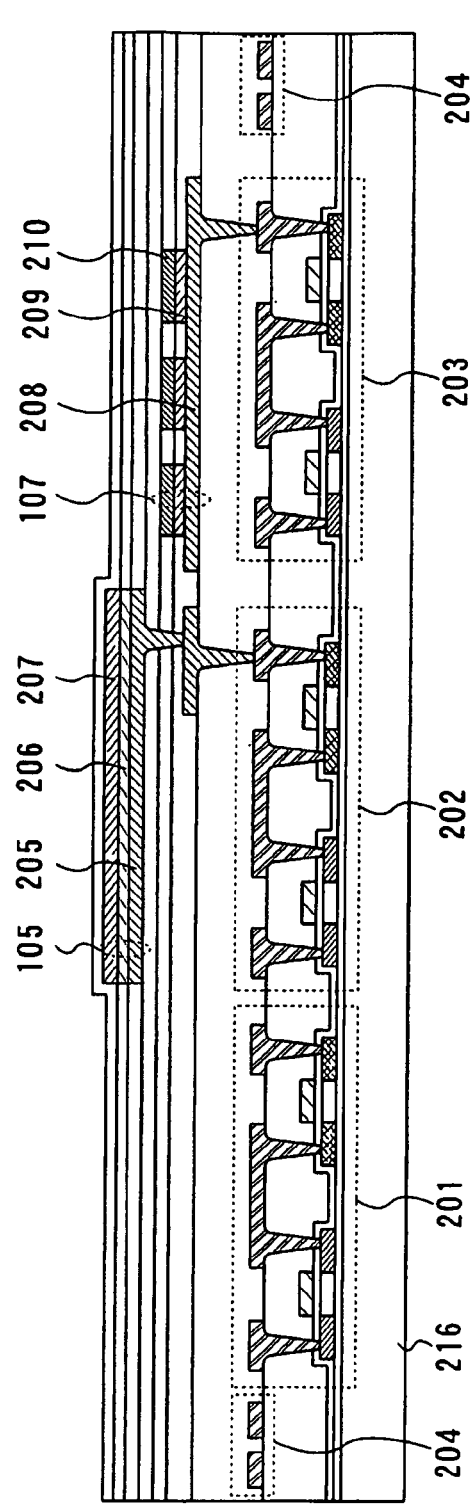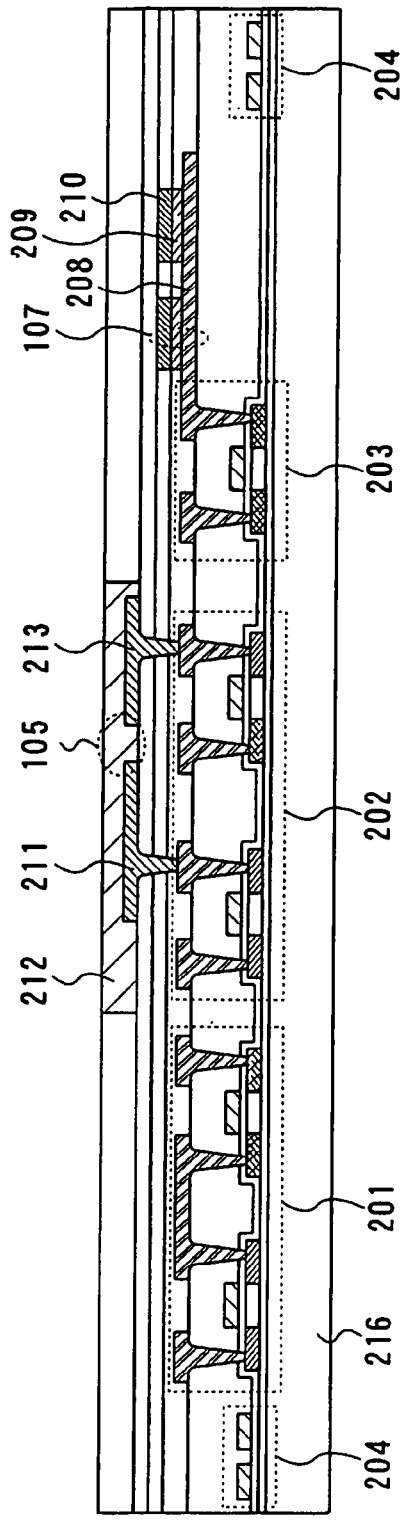
FIG. 3A
FIG. 3B

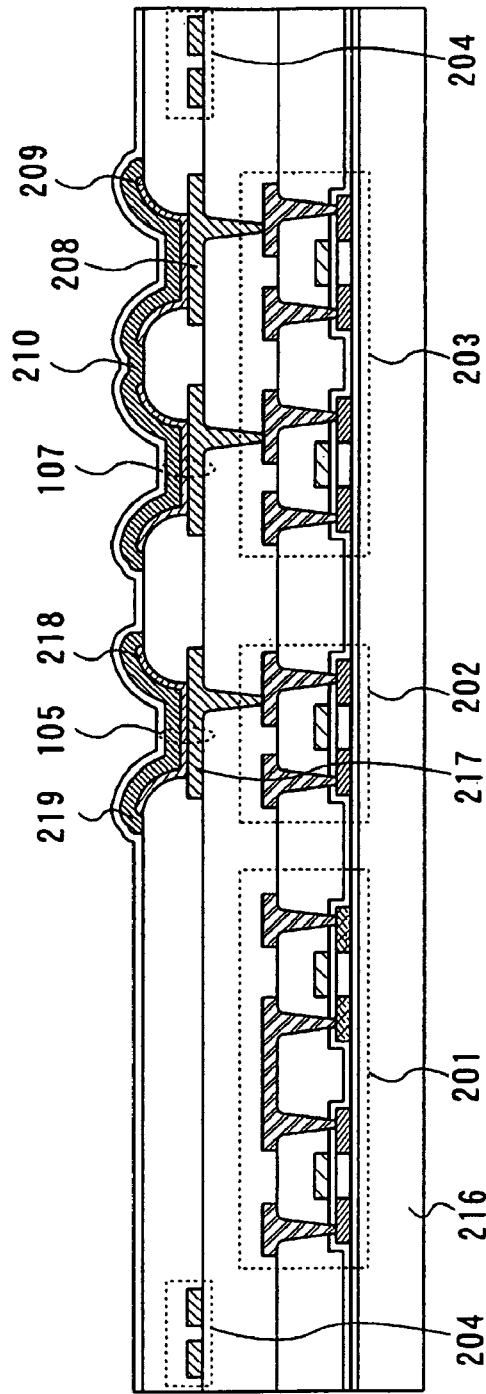
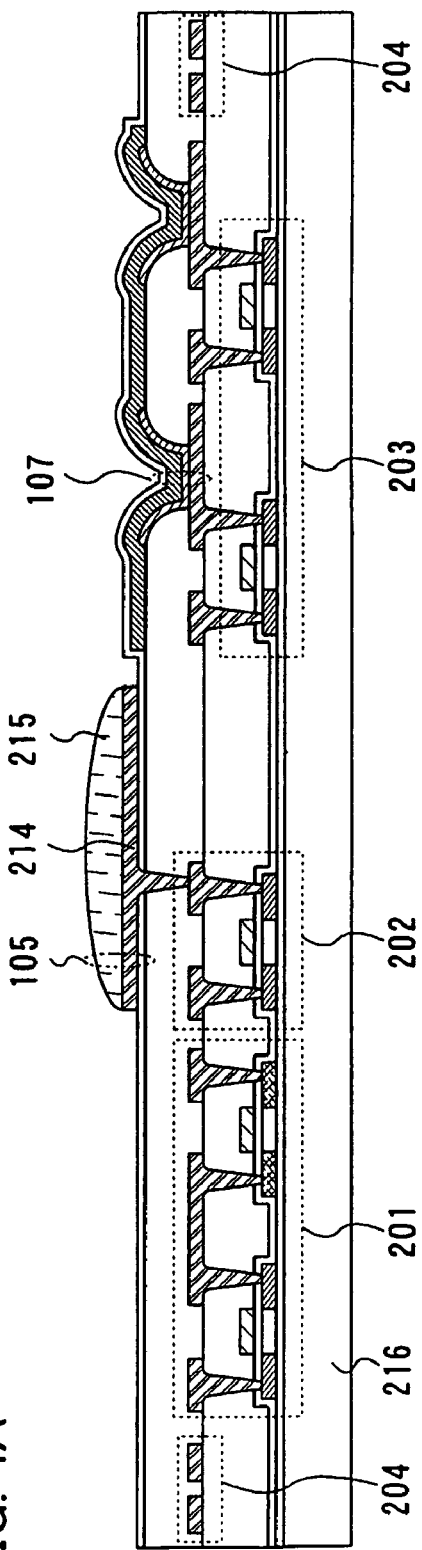
FIG. 4A
FIG. 4B

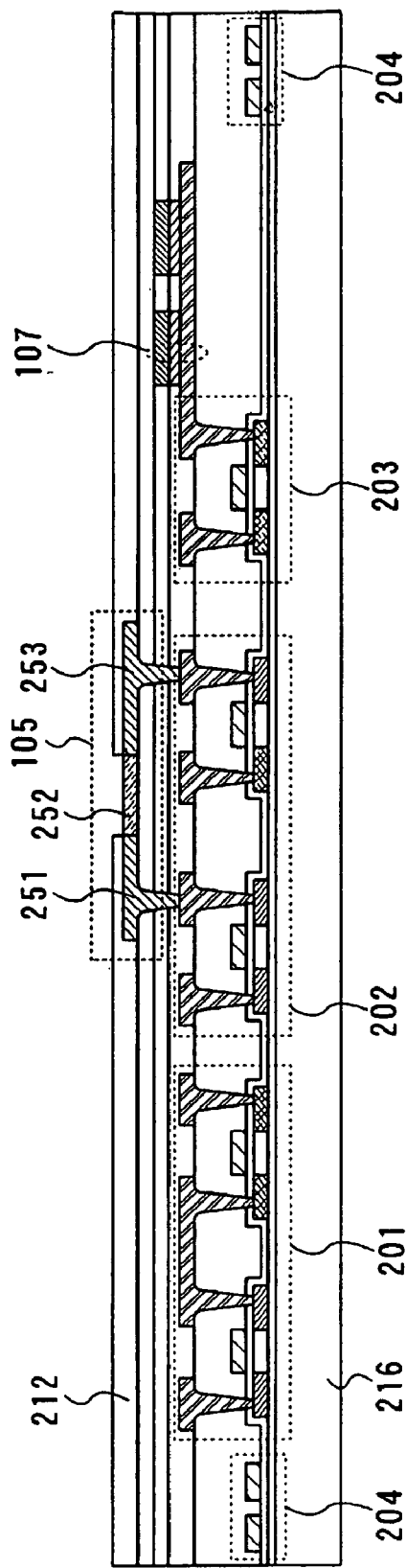
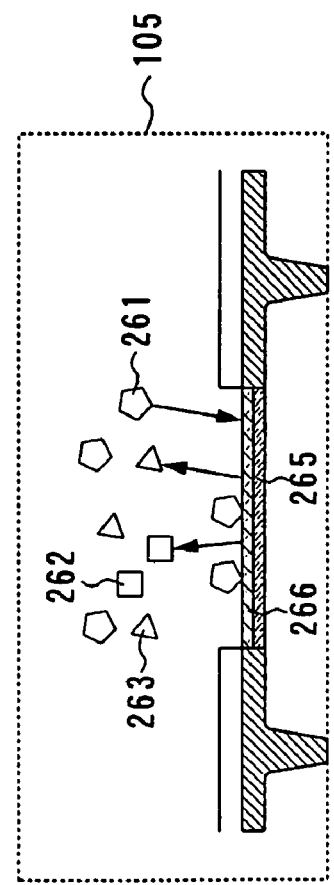
FIG. 13A
FIG. 13B

SEMICONDUCTOR DEVICE, AND METHOD FOR MANUFACTURING THEREOF

TECHNICAL FIELD

The present invention relates to a semiconductor device that can transmit and receive diverse information without being contacted therewith.

BACKGROUND ART

In recent years, an object recognition technology has been attracting attention. In this object recognition technology, information such as a history of an object is clarified by assigning an ID (identification number) to the respective object. This is useful for production and management of the object. In particular, a semiconductor device that can transmit and receive data without being contacted therewith has been developed. As such a semiconductor device, an RFID tag (Radio Frequency Identification) (also referred to as an ID tag, an IC tag, an IC chip, an RF (Radio Frequency) tag, a wireless tag, an electronic tag, and a wireless chip) and the like have been introduced in businesses, markets and the like on a trial basis.

Generally, an RFID tag includes an integrated circuit portion having a transistor and the like and an antenna, and can perform communication with an external device (reader/writer) through an electromagnetic wave. Recently, it has been tried to monitor or control a product by providing an RFID tag for various products. For example, not only inventory management such as an inventory quantity or an inventory status of a product but also a product control system that can control a product automatically in a simple way is proposed by attaching an RFID tag to a product (Reference 1: Japanese Patent Application Laid-Open No. 2004-359363). In addition, in order to increase the effect of crime prevention, it is proposed to use an RFID tag for a security device and a security system (Reference 2: Japanese Patent Application Laid-Open No. 2003-303379). Moreover, a method for preventing illicit use due to exploitation or the like is proposed by mounting an RFID tag on a bill, securities, or the like (Reference 3: Japanese Patent Application Laid-Open No. 2001-260580). Thus, an RFID tag is proposed to be used in various categories.

DISCLOSURE OF INVENTION

It is an object of the present invention to provide a device suitable for new usage by making use of a semiconductor device such as an RFID tag in terms of the capability to transmit and receive data without being contacted therewith, to decrease a burden on a user, and to improve convenience.

In order to achieve the above object, the following measures are taken in the present invention.

According to one feature of the present invention, a semiconductor device has an arithmetic processing circuit including a transistor, a conductive layer serving as an antenna, and a detecting unit having a means for detecting physical quantity or chemical quantity, where the arithmetic processing circuit, the conductive layer, and the detecting unit are covered with a protective layer. Note that, in the present invention, physical quantity refers to temperature, pressure, airflow, light, magnetism, acoustic wave, oscillation, acceleration, humidity, or the like, and chemical quantity refers to a chemical substance or the like such as a gas component of gas or the like or a liquid component of ion or the like. The chemical quantity also includes an organic compound such as a specific biological substance (for example, blood-sugar level or the like contained in blood) contained in blood, sweat, urine, or the like as well.

In addition, according to another feature of the present invention, a semiconductor device has an arithmetic processing circuit including a transistor, a conductive layer serving as an antenna, a detecting unit having a means for detecting physical quantity or chemical quantity, and a storage unit for storing data detected by the detecting unit, where the arithmetic processing circuit, the conductive layer, the detecting unit, and the storage unit are covered with a protective layer.

Moreover, according to another feature of the present invention, a semiconductor device comprises an element having a transistor provided over a substrate, a detecting element electrically connected to the transistor and provided over the element, and a conductive layer serving as an antenna, where the substrate, the element, the detecting element, and the antenna are covered with a protective layer.

Further, according to another feature of the present invention, a semiconductor device comprises an element at least having a first transistor, a second transistor, and a third transistor provided over a substrate; a detecting element electrically connected to the first transistor and provided over the element; a storage element electrically connected to the second transistor and provided over the element; and a conductive layer serving as an antenna electrically connected to the third transistor and provided over the element, wherein the substrate, the element, the detecting element, the storage element, and the conductive layer serving as an antenna are covered with a protective layer.

Furthermore, according to another feature of the present invention, a semiconductor device comprises an element at least having a first transistor, a second transistor, and a third transistor provided over a substrate; a detecting element electrically connected to the first transistor and provided over the element; a storage element electrically connected to the second transistor and provided over the element; and a conductive layer serving as an antenna electrically connected to the third transistor and provided over the element, wherein the storage element has a structure where a first conductive layer formed over the element, an organic compound layer, and a second conductive layer are stacked, and wherein the substrate, the element, the detecting element, the storage element, and the conductive layer serving as an antenna are covered with a protective layer.

According to the above features, the detecting element can be provided to have a stacked structure of a first layer, a second layer, and a third layer. In addition, in the detecting element, the first layer and the second layer may be disposed in parallel in the same layer so that the second layer is disposed in parallel between the first layer and the third layer. In this structure, the second layer can also be provided to cover the first layer and the third layer.

In addition, according to the above features, a glass substrate or a substrate having flexibility can be used as the substrate.

According to the above features, the semiconductor device of the present invention contains silicon oxide, silicon nitride, silicon oxynitride, diamond-like carbon (DLC), or carbon nitride as the protective layer.

By applying the present invention, downsizing and lightweighting of a semiconductor device capable of detecting various physical quantity or chemical quantity can be achieved. In addition, in a semiconductor device of the present invention, the surface of the semiconductor device is covered with a protective layer such as diamond-like carbon (DLC); therefore, noninvasiveness can be maintained even when the semiconductor device is implanted in the body of human beings or animals. Moreover, since a semiconductor device of the present invention can be provided to have flexibility, the semiconductor device can also be provided to an object having a curved surface.

In addition, by having a detecting element and a detection-control circuit for converting data detected by the detecting element into an electrical signal or the like, a semiconductor device of the present invention can detect various physical quantity or chemical quantity and can display the data through a reader/writer without being contacted therewith.

Accordingly, a semiconductor device of the present invention can decrease a burden on a user and improve convenience even when being provided to human beings or animals and plants.

BRIEF DESCRIPTION OF DRAWINGS

FIGS. 3A and 3B are views each showing one example of a semiconductor device according to the present invention;

FIGS. 4A and 4B are views each showing one example of a semiconductor device according to the present invention;

FIGS. 13A and 13B are views each showing one example of a semiconductor device according to the present invention;

BEST MODE FOR CARRYING OUT THE INVENTION

Figure 1:
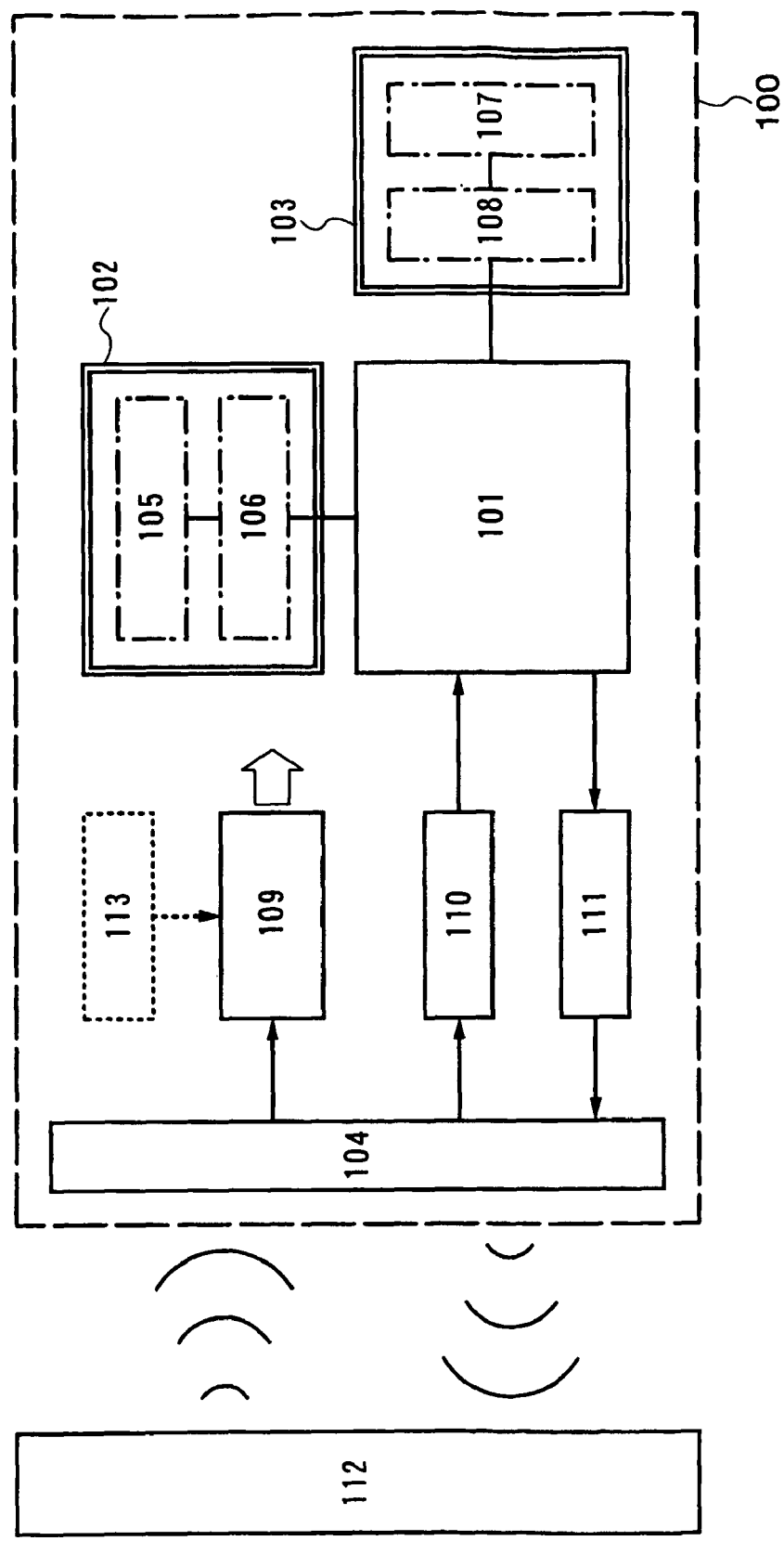
FIG. 1 is a diagram showing one example of a semiconductor device according to the present invention.

Embodiment Mode of the present invention will be explained below with reference to the accompanying drawings. However, it is to be easily understood that various changes and modifications will be apparent to those skilled in the art. Therefore, unless such changes and modifications depart from the invention, they should be construed as being included therein. Note that identical portions or portions having the same function in all figures for explaining embodiment modes are denoted by the same reference numerals and detailed descriptions thereof are omitted.
(Embodiment Mode 1)

In this embodiment mode, one example of a semiconductor device according to the present invention will be explained with reference to drawings.

A semiconductor device 100 shown in this embodiment mode is provided with an arithmetic processing circuit 101, a detecting unit 102, a storage unit 103, an antenna 104, and the like, and includes a function to communicate data with an external device (for example, a reader/writer 112) through the antenna 104 without being contacted therewith (FIG. 1).

According to a signal imputed from the reader/writer 112, the arithmetic processing circuit 101 communicates data with the detecting unit 102 or the storage unit 103. For example, the arithmetic processing circuit 101 extracts the data detected in the detecting unit 102, writes the data into the storage unit 103, or read the data written into the storage unit 103. Then, arithmetic processing is performed based on the data or the like detected in the detecting unit 102 to output the result into the reader/writer 112.

The detecting unit 102 can detect temperature, pressure, airflow, light, magnetism, acoustic wave, acceleration, humidity, a gas component, a liquid component, or other properties by a physical or chemical means. In addition, the detecting unit 102 includes a detecting element 105 for detecting physical quantity or chemical quantity and a detection control circuit 106 for converting the physical quantity or the chemical quantity detected by the detecting element 105 into an appropriate signal such as an electrical signal. The detecting element 105 can be formed of a resistance element, a photoelectric conversion element, a thermo-electromotive force element, a transistor, thermistor, a diode, or the like. Note that a plurality of the detecting units 102 may be provided, and in this case, it is possible to detect a plurality of physical quantity or chemical quantity simultaneously.

In addition, herein, the physical quantity refers to temperature, pressure, airflow, light, magnetism, acoustic wave, acceleration, humidity, or the like, and the chemical quantity refers to a chemical substance such as a gas component of gas or the like or a liquid component of ion or the like. The chemical quantity also includes an organic compound such as a specific biological substance (for example, blood-sugar level or the like contained in blood) contained in blood, sweat, urine, or the like as well. In particular, when chemical quantity is to be detected, a particular substance is inevitably to be detected selectively. Therefore, a substance that reacts selectively with a substance that is to be detected in the detecting element 105 is provided in advance. For example, when a biological substance is detected, an enzyme, an antibody molecule, a microorganism cell, or the like that reacts selectively with a biological substance to be detected in the detecting element 105 is preferably provided by being immobilized in a high molecular weight material or the like.

The storage unit 103 can store data or the like detected by the detecting unit 102, and includes a storage element 107 where data are stored and a control circuit 108 for controlling writing, reading, or the like of the data into the storage element 107. Note that the storage unit 103 is not limited to one and a plurality of the storage units 103 such as a SRAM, a flash memory, an ROM, a FeRAM, or an organic memory can be used. In addition, the storage unit 103 can be provided with the combination thereof. Note that the organic memory refers to a memory in which a layer having an organic compound is sandwiched between a pair of electrodes. The organic memory can be formed in a compact, a thinner film, and with a large capacity simultaneously at low cost. Therefore, by providing the storage unit 103 with the organic memory, downsizing, lightweighting, and low cost of a semiconductor device can be achieved.

Then, data communication between the reader/writer 112 and the semiconductor device 100 will be explained briefly. First, a signal transmitted from the reader/writer 112 as an electromagnetic wave is converted into an AC electrical signal in the antenna 104. Then, a power supply voltage is generated in a power supply circuit 109 with the use of the AC electrical signal to supply each circuit with the power supply voltage. In a demodulation circuit 110, the AC electrical signal is demodulated to supply the arithmetic processing circuit 101 therewith. In the arithmetic processing circuit 101, according to the inputted signal, each arithmetic processing is performed, the detecting unit 102, the storage unit 103, or the like is commanded, and data communication is performed. Then, the data detected in the detecting unit 102 is transmitted from the arithmetic processing circuit 101 to a modulation circuit 111, and load modulation is added to the antenna 104 according to the data from the modulation circuit 111. By receiving the load modulation added to the antenna 104 through an electromagnetic wave, consequently, the reader/writer 112 can read out the data.

Note that the semiconductor device 100 shown in this embodiment mode may be a type in which each circuit is supplied with a power supply voltage by an electromagnetic wave without providing a power supply (a battery 113), a type in which each circuit is supplied with a power supply voltage with the use of a battery 113 by providing the battery 113, or a type in which each circuit is supplied with a power supply voltage with the use of an electromagnetic wave and a battery 113 by providing the battery 113. When the semiconductor device is not provided with the buttery, there is no necessity to exchange the battery; thus, the semiconductor device can realize to be manufactured at low cost.

Figure 2:
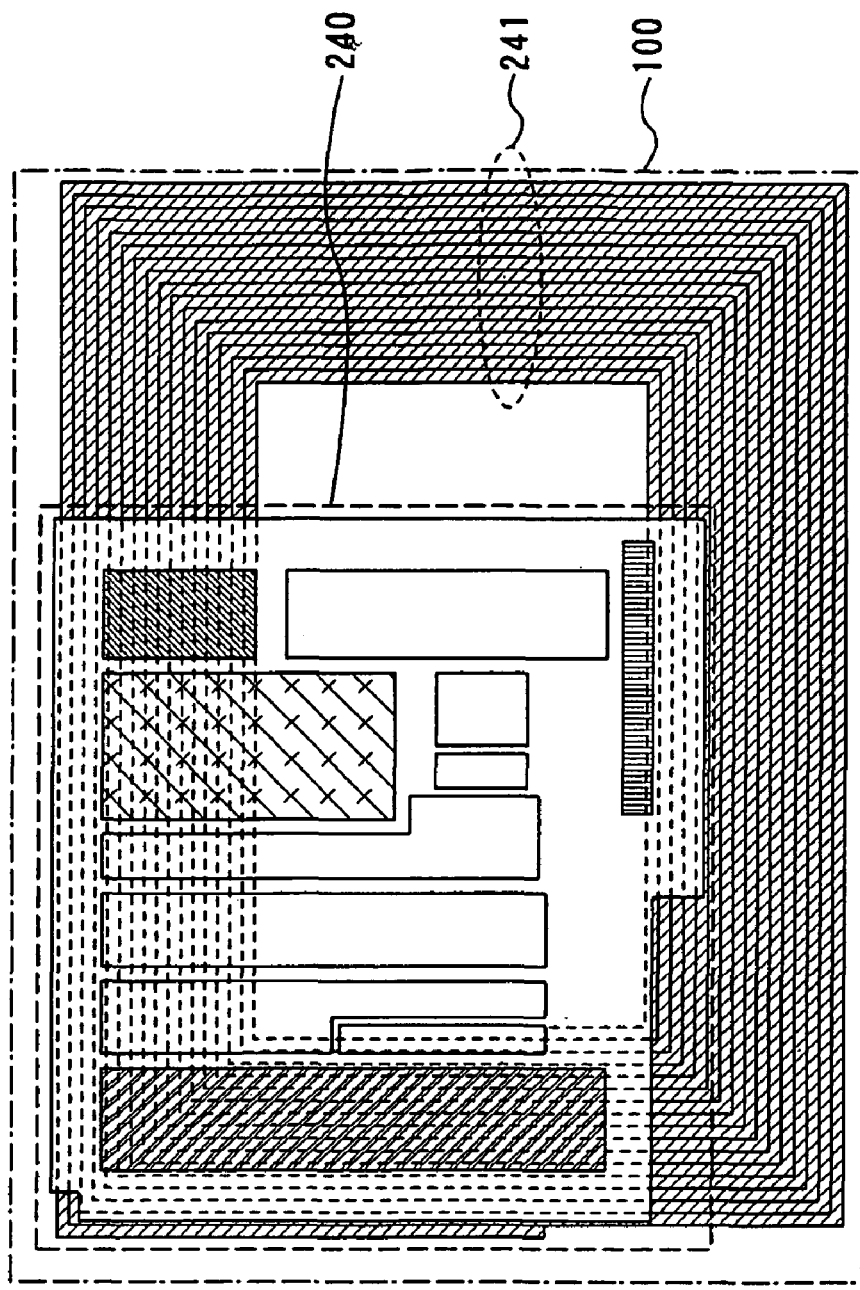
FIG. 2 is a view showing one example of a semiconductor device according to the present invention.

Next, one example of a top view structure of a semiconductor device according to the present invention will be explained with reference to FIG. 2. A semiconductor device 100 shown in FIG. 2 has a thin film integrated circuit 240 provided with a plurality of elements included in a circuit such as an arithmetic processing circuit 101, and a conductive layer 241 serving as an antenna 104. The conductive layer 241 serving as the antenna 104 is electrically connected to the thin film integrated circuit 240. Note that this embodiment mode shows an example of providing the conductive layer 241 serving as the antenna 104 in a coil and applying an electromagnetic induction type or an electromagnetic coupling type. However, a semiconductor device of the present invention is not limited to thereto and a microwave type can also be applied. In the case of the microwave type, the shape of the conductive layer 241 serving as the antenna 104 may be appropriately decided according to the wavelength of an electromagnetic wave to be used. In addition, downsizing of a semiconductor device can be tried by providing the conductive layer 241 serving as the antenna 104 and the thin film integrated circuit 240 so as to overlap.

Then, a cross-sectional structure of the semiconductor device 100 according to the present invention including the arithmetic processing circuit 101, the detecting unit 102, the storage unit 103, and the antenna 104 will be explained with reference to FIGS. 3A and 3B and FIGS. 4A and 4B. Note that, herein, the detecting unit 102 has a structure including the detecting element 105 and the detection control circuit 106, and the storage unit 103 has a structure including the storage element 107 and the control circuit 108.

A semiconductor device shown in FIG. 3A has an element 201 included in the arithmetic processing circuit 101, an element 202 included in the detection control circuit 106, an element 203 controlling the control circuit 108, and a conductive layer 204 serving as the antenna 104. In FIG. 3A, the detecting element 105 corresponds to a stack of a first layer 205, a second layer 206, and a third layer 207, and is electrically connected to the element 202 included in the detection control circuit 106. The storage element 107 corresponds to a stack of a first conductive layer 208, a layer 209 containing an organic compound, and a second conductive layer 210, and is electrically connected to the element 203 included in the control circuit 108.

The elements 201, 202, and 203 each include a transistor, a capacitor element, a resistance element, and the like, and a structure shown in the view shows a plurality of transistors as the elements 201, 202, and 203. As for the transistors, a thin film transistor (TFT) may be provided or a field effect transistor (FET) in which a semiconductor substrate of Si or the like is provided with a channel layer may be provided. In addition, the conductive layer 204 serving as the antenna is electrically connected to the transistors or the like included in the element 201.

As for the first conductive layer 208 or the second conductive layer 210, one element of gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like, or a single layer or a stacked structure formed of an alloy containing a plurality of the elements can be used. For example, an alloy or the like containing Al and Ti can be given as an example of the alloy. In addition, additionally, it is possible to use another light-transmitting oxide conductive material such as indium tin oxide (ITO), zinc oxide (ZnO), indium oxide zinc (IZO), or zinc oxide added with gallium (GZO). A material with the use of a target in which indium oxide containing silicon oxide further mixed with 2 wt. % to 20 wt. % of zinc oxide (ZnO) may be used.

As for the layer 209 containing an organic compound, a single layer or a stacked structure of a low molecular weight compound such as 4,4'-bis[N—(1-naphthyl)—N-phenyl-amino]-biphenyl (abbreviation: α-NPD) or 4,4'-bis[N—(3-methylphenyl)—N-phenyl-amino]-biphenyl (abbreviation: TPD), or a single layer or a stacked structure of a high molecular weight compound such as poly(p-phenylenevinylene) (PPV), [methoxy-5-(2-ethyl)hexyloxy]-p-phenylenevinylene (MEH-PPV), poly(9,9-dialkylfluorene) (PAF), poly(9-vinylcarbazole) (PVK), polypyrrole, polythiophene, polyacetylene, polypyrene, or polycarbazole can be used. In addition to a layer formed of the low molecular weight compound or the high molecular weight compound, a layer in which the low molecular weight compound or the high molecular weight compound is mixed with an inorganic compound can be provided by being stacked. In addition, although FIG. 3A shows the storage element 107 in the case where a passive matrix type is used, an active matrix type may also be used.

In addition, the conductive layer 204 serving as the antenna is exemplified in the case where being provided in the same layer as a source wiring or a drain wiring of a transistor; however, the conductive layer 204 may be provided in the same layer as a gate electrode of a transistor, a pair of conductive layers included in the storage element 107, or the conductive layer included in the detecting element. Accordingly, by providing the conductive layer serving as the antenna in the same layer as the conductive layers included in the other elements, there is no necessity to provide a step of forming the conductive layer serving as the antenna independently; thus, a step of forming the conductive layer serving as the antenna and a step of forming the conductive layers of the other elements can be performed concurrently. Therefore, a manufacturing process can be simplified and reduction in manufacturing cost and improvement in yield can be realized. In addition, when the conductive layer serving as the antenna is provided separately from the conductive layers included in the other elements, simplification of a manufacturing process and improvement of efficiency in the use of a material can be realized by forming the conductive layer serving as the antenna with the use of a printing method such as screen printing or a droplet discharging method. Note that this embodiment mode shows an example of providing the conductive layer 204 serving as the antenna in the same layer as the conductive layers included in the other elements; however, it is also possible to provide the conductive layer serving as the antenna by manufacturing separately and attaching so as to be electrically connected to a transistor in the subsequent step.

The structure of the detecting element 105 depends on physical quantity or chemical quantity to be detected. In other words, the detecting element 105 has different effect depending on its structure. For example, when the first layer 205, the second layer 206, and the third layer 207 each included in the detecting element 105 are a p-type semiconductor layer, an I-type semiconductor layer, and an N-type semiconductor layer, respectively, the detecting element 105 corresponds to a PIN diode. The PIN diode has a property that current flows when being irradiated with light and can detect the light.

Note that, as for the element for detecting light, not only the PIN diode but also other elements such as a PN diode, a Schottky diode, an avalanche diode, a phototransistor, a photo triac, or photothyristor may also be used.

In addition, when the first layer 205, the second layer 206, and the third layer 207 each included in the detecting element 105 are a conductive layer, a compound semiconductor layer, and a semiconductor layer, respectively, the detecting element 105 can detect an ultraviolet ray. This is because the detecting element 105 has a property that current flows when being irradiated with an ultraviolet ray. The conductive layers used for the first layer 205 and the third layer 207 are formed of a known conductive material, and the compound semiconductor layer used for the second layer 206 is formed of a semiconductor including one or more elements of aluminum (Al), gallium (Ga), and indium (In), and nitrogen. The crystalline structure of the compound semiconductor layer may be either amorphous or microcrystalline.

Moreover, when the first layer 205, the second layer 206, and the third layer 207 each included in the detecting element 105 are a conductive layer, a piezoelectric layer, and a conductive layer, respectively, the detecting element 105 can detect the pressure change. This is because the capacitance of the detecting element 105 is changed with change in pressure; thus, pressure change can be detected by reading out change in capacitance. The piezoelectric layer is formed from a material including lead, titanium, zirconium, and oxygen, or a material including lead, strontium, titanium, zirconium, and oxygen.

Note that, when the first layer 205 of the detecting element 105 is provided to be a conductive layer with the same material as the conductive layer 204 serving as the antenna, it can be tried to simplify a manufacturing process by forming the first layer 205 and the conductive layer 204 serving as the antenna in the same layer with the same material. In addition, when the first layer 205 is provided to be a conductive layer with the same material as the first conductive layer 208, it can be tried to simplify a manufacturing process by forming the first layer 205 and the first conductive layer 208 with the use of the same material in the same layer. Moreover, it is also possible to provide the first layer 205, the first conductive layer 208, and the conductive layer 204 serving as the antenna with the use of the same material in the same layer.

Next, a cross-sectional structure of a semiconductor device 100 according to the present invention which is different from the above structure will be explained with reference to FIG. 3B. The semiconductor device shown in FIG. 3B has a detecting element 105, a storage element 107, elements 201, 202, and 203, and a conductive layer 204. Although a source wiring or a drain wiring of a transistor is herein a first conductive layer 208 of the storage element 107, needless to say, the first conductive layer may be provided separately through an insulating film over the source wiring or the drain wiring as shown in FIG. 3A. In addition, although the conductive layer 204 serving as the antenna 104 is provided in the same layer as a conductive layer for forming a gate electrode, the conductive layer 204 serving as the antenna 104 may be provided in the same layer as the source wiring or the drain wiring of the transistor as mentioned above, a pair of conductive layers for forming the storage element 107, or a conductive layer for forming the detecting element. Of course, the conductive layer serving as the antenna 104 may be formed with the use of a printing method or a droplet discharging method. Alternatively, after providing the conductive layer over a separate substrate from the substrate where a transistor is formed, the conductive layer may be provided by being attached to the substrate where the transistor is formed. Although FIG. 3B shows the storage element 107 in the case where a passive matrix type is used, an active matrix type may also be used.

The detecting element 105 has a conductive layer 211, a hygroscopic layer 212, and a conductive layer 213. The hygroscopic layer 212 contains an organic material having hygroscopicity, specifically, polyimide, acrylic, or the like. Besides, a material containing as the base a cellulosic hydrophilic high molecular weight material, ammonium salt, or sulfonic acid group; porous ceramic; lithium chloride; or the like can be used for the hygroscopic layer 212. When water penetrates into the hygroscopic layer 212, the dielectric constant of the hygroscopic layer 212 is changed in accordance with the amount of the penetrated water. Consequently, the capacitance of the detecting element 105 is changed. By reading out the capacitance that thus changed in accordance with the ambient circumstance, the humidity can be detected. In addition, by providing the third layer 207 shown in FIG. 3A with the use of a conductive layer in a thin film, the hygroscopic layer absorbs or discharges the moisture through the conductive layer in the detecting element 105; therefore, it is possible to have a structure where the hygroscopic layer 212 is sandwiched between the conductive layers.

Note that, when the conductive layer 211 or the conductive layer 213 of the detecting element 105 are provided with the same material as the conductive layer 204 serving as the antenna, it can be tried to simplify a manufacturing process by forming the conductive layer 211 or the conductive layer 213 and the conductive layer 204 serving as the antenna with the use of the same material in the same layer. In addition, when the conductive layer 211 or the conductive layer 213 of the detecting element 105 is provided with the same material as the first conductive layer 208, it can be tried to simplify a manufacturing process by forming the first layer 205 and the first conductive layer 208 with the use of the same material in the same layer. Moreover, it is also possible to provide the conductive layer 211, the conductive layer 213, the first conductive layer 208, and the conductive layer 204 serving as the antenna with the use of the same material in the same layer.

Next, a cross-sectional structure of a semiconductor device 100 which is different from the above structure will be explained with reference to FIG. 4A. The semiconductor device shown in FIG. 4A has a detecting element 105, a storage element 107, elements 201, 202, and 203, and a conductive layer 204. Although, herein, an insulating film is provided over a source wiring or a drain wiring of a transistor and a first layer of the detecting element 105 and a first conductive layer 208 of the storage element 107 are formed over the insulating film, it is also possible to provide the first layer and the first conductive layer 208 in the same layer as the source wiring or the drain wiring. Although FIG. 4A shows the storage element 107 in the case where an active matrix type is used, a passive matrix type may also be used.

The detecting element 105 has a conductive layer 217, a layer 218 containing an organic compound, and a conductive layer 219. The resistance value of the detecting element 105 is changed with change in the ambient temperature. Temperature is detected by reading out the resistance that thus changed in accordance with the ambient circumstance.

Note that the element including a layer 218 containing an organic compound is used as an element for detecting temperature in the above structure; however, the present invention is not limited to this structure. A transistor may be used as the element for detecting temperature. The resistance value between the source and drain of a transistor is changed with change in the ambient temperature. Temperature can be detected by reading out the resistance value that thus is changed.

Note that when the conductive layer 217 of the detecting element 105 is provided with the same material as the conductive layer 204 serving as the antenna, it can be tried to simplify a manufacturing process by forming the first layer 205 and the conductive layer 204 serving as the antenna with the use of the same material in the same layer. In addition, when the conductive layer 217 of the detecting element 105 is provided with the same material as the first conductive layer 208, it can be tried to simplify a manufacturing process by forming the first layer 205 and the first conductive layer 208 with the use of the same material in the same layer. Moreover, it is also possible to provide the conductive layer 217, the first conductive layer 208, and the conductive layer 204 serving as the antenna with the use of the same material in the same layer. Further, when the layer 218 containing an organic compound of the detecting element 105 is provided with the same material as a layer 209 containing an organic compound of the storage element 107, it can be tried to simplify a manufacturing process by forming the layer 218 containing an organic compound with the use of the same material as the layer 209 containing an organic compound in the same layer. Note that, in this case, the conductive layer 219 of the detecting element 105 and a second conductive layer 210 of the storage element 107 may be formed with the same material.

Next, a cross-sectional structure of a semiconductor device 100 which is different from the above structure will be explained with reference to FIG. 4B. The semiconductor device shown in FIG. 4B has a detecting element 105, a storage element 107, elements 201, 202, and 203, and a conductive layer 204. Although a source wiring or a drain wiring of a transistor is herein a first conductive layer of the storage element 107, needless to say, the first conductive layer may be provided separately through an insulating film over the source wiring or the drain wiring as shown in FIG. 4A. In addition, although the conductive layer 204 serving as the antenna 104 is provided in the same layer as the first conductive layer for forming the storage element 107 and a first layer for forming the detecting element, the conductive layer 204 can be provided in another layer mentioned above.

The detecting element 105 has a conductive layer 214 and a response layer 215. The conductive layer 214 is formed of a known conductive material. The response layer 215 is formed using a material in which either or both of metal nitrite and metal nitrate is used when a nitrogen dioxide gas or a nitrogen monoxide gas is targeted to be detected. In addition, when carbon dioxide is targeted to be detected, a material in which either or both of metal carbonate and metal hydrogen carbonate is used. The metal nitride is, for example, lithium nitrite, sodium nitrite, or the like. The metal nitrate is, for example, lithium nitrate, sodium nitrate, or the like. The metal carbonate is, for example, lithium carbonate, sodium carbonate, or the like. The metal hydrogen carbonate is, for example, sodium hydrogen carbonate, potassium hydrogen carbonate, or the like. In the response layer 215, depending on the change in partial pressure of the gas that is targeted to be detected, electrochemical dissociation equilibrium is generated. This leads to generate change in electromotive force, which is transmitted to the element 202. The element 202 can detect the ambient gas by reading out such electromotive force change.

Next, a cross-sectional structure of a semiconductor device 100 which is different from the above structure will be explained with reference to FIGS. 13A and 13B. The semiconductor device shown in FIG. 13 has a detecting element 105, a storage element 107, elements 201, 202, and 203, and a conductive layer 204. FIGS. 13A and 13B explain the case where a chemical substance formed of an organic compound or the like such as a biological substance is selectively distinguished.

The detecting element 105 has a structure where a first layer 251, a second layer 252, and a third layer 253 are disposed in parallel (FIG. 13A). Note that, herein, the case where the first layer 251 to the third layer 253 are disposed in parallel is shown; however, as mentioned above, the first layer 251 to the third layer 253 may be provided in a stack, or alternatively, the first layer 251 and the third layer 253 may be disposed in parallel and the second layer 252 may be provided so as to cover the first layer 251 and the third layer 253.

In addition, as for the first layer 251 and the third layer 253, a known conductive layer is used as well as in FIGS. 3A and 3B and FIGS. 4A and 4B. As for the conductive layer, one element of gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like, or a single layer or a stacked structure formed of an alloy containing a plurality of the elements can be used.

As for the second layer 252, a substance (an identification element) that reacts selectively with a substance to be detected is provided. For example, an enzyme 266 that reacts selectively with a material to be detected is provided over a base substance 265 of a high molecular weight material or the like with the use of a known means to be immobilized. Then, by having the second layer 252 being in contact with blood, sweat, urine, or the like, only the specific substance contained therein reacts with the second layer 252, which consequently detected in the detecting element 105. In addition, besides the enzyme, various proteins, DNA, an antibody molecule, a microorganism cell, or the like can be provided to be immobilized over the base substance 265 according to a substance to be detected.

Herein, the case where there are three kinds of substances of biological substances 261 to 263 will be explained briefly. When the enzyme 266 and the biological substance 261 react selectively, the detecting element 105 detects the existence or content of the biological substance 261 by the resistance or current value between the first layer 251 and the third layer 253. More specifically, due to biochemical reaction between the enzyme 266 which is an identification element immobilized to the base substance 265 of a high molecular weight material or the like and the biological substance 261, the detection is performed by measuring in the first layer and the third layer a chemical substance that is generated or consumed. On the other hand, since the biological substances 262 and 263 do not react with the enzyme 266, the substances are not detected at all (FIG. 13B). Accordingly, by providing the second layer 252 with an enzyme or the like that reacts with a substance to be detected in the detecting element 105, information on the existence, content, or the like of the specific biological substance becomes accessible. In addition, a plurality of detecting elements is provided and an enzyme or the like that reacts with the specific biological substance is provided to each detecting element. Therefore, it becomes possible to detect a plurality of biological substance at a time. Moreover, FIGS. 13A and 13B shows as the detecting element 105 a structure where the second layer 252 provided with the identification element between the first layer and the second layer each formed of a conductive layer; however, it is also possible to use an ISFET (Ion Sensitive Field Effect Transistor) or the like as well as the detecting element 105.

Note that the structures shown in FIGS. 3A and 3B, FIGS. 4A and 4B, and FIGS. 13A and 13B can be arbitrarily combined. In other words, structures where a position to provide the conductive layer 204 serving as the antenna 104, a position to provide the storage element 107 and its structure (a passive matrix type or an active matrix type), a position to provide the detecting element 105, or the like can be arbitrarily combined are all included in a semiconductor device of the present invention.

In addition, in the above structure, although the arithmetic processing circuit 101, the detecting unit 102, the storage unit 103, and the antenna 104 are provided over a substrate 216, the present invention is not limited to this structure. A plurality of elements included in the arithmetic processing circuit 101 and the like may be peeled from the substrate 216. By peeling the plurality of elements from the substrate 216, downsizing, thinning, lightweight can be realized.

Figure 5A:
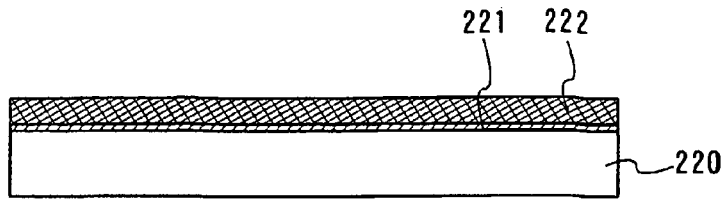
FIGS. 5A to 5E are views each showing one example of a semiconductor device according to the present invention.

Thus, a procedure of peeling the plurality of elements from the substrate 216 will be explained with reference to FIGS. 5A to 5E. First, a peeling layer 221 and a layer 222 including a plurality of thin film integrated circuits are formed in a stack over a substrate 220 (FIG. 5A). The peeling layer 221 is formed of a material containing one or more elements of tungsten, molybdenum, and silicon by a known means (a sputtering method, a plasma CVD method, or the like). The layer 222 including a plurality of thin film integrated circuits is provided with a plurality of elements included in the arithmetic processing circuit 101 and the like.

Figure 5B:
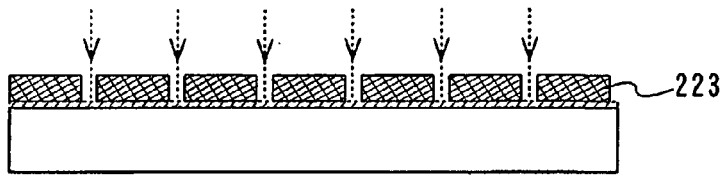
Figure 5C:
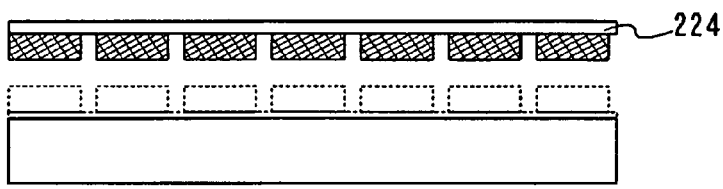

Next, a thin film integrated circuit 223 is peeled from the substrate 220. Herein, with the irradiation of laser light (for example, UV light), an opening is formed selectively in the layer 222 including a plurality of thin film integrated circuits to expose the peeling layer 221 (FIG. 5B). Thereafter, the thin film integrated circuit 223 is peeled from the substrate 220 with the use of physical force. In addition, after forming the opening, etchant may be introduced to the opening before peeling the thin film integrated circuit 223 from the substrate 220 to remove the peeling layer 221 and then peel the thin film integrated circuit 223. Herein, as well as removing the peeling layer 221 by introducing the etchant to the opening, the layer 222 including a plurality of thin film integrated circuits is divided to form the plurality of the thin film integrated circuits 223. As for the etchant, gas or liquid containing halogen fluoride, specifically, chlorine trifluoride ($ClF_3$) is preferably used. Then, one side of the thin film integrated circuit 223 is attached to a base substance 224 (also referred to as a substrate 224) to peel the thin film integrated circuit 223 from the substrate 220 (FIG. 5C).

Figure 5D:
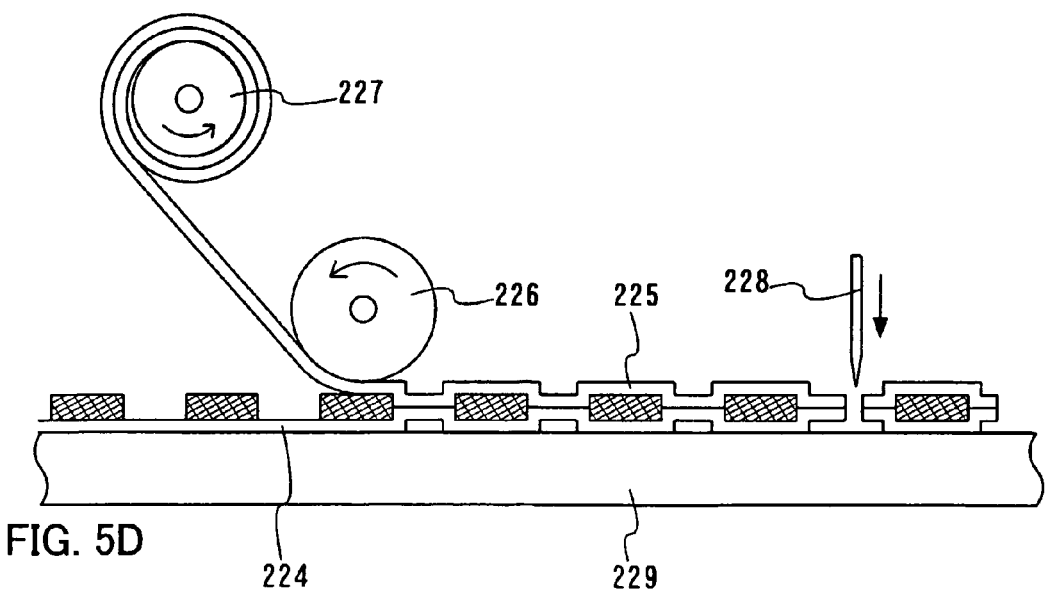
Figure 5E:
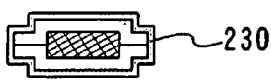

Then, the other side of the thin film integrated circuit 223 is attached to a base substance 225 to seal the thin film integrated circuit 223 between the base substances 224 and 225 (FIG. 5D). In this case, the thin film integrated circuit 223 sealed between the base substances 224 and 225 can be formed sequentially by using a sealing roller 226 for performing either or both heat treatment and pressure treatment, a supply roller 227 wound with the base substance 225, and a belt conveyor 229. Thereafter, the base substances 224 and 225 are cut by a cutting means 228. Accordingly, the thin film integrated circuit 223 sealed between the base substances 224 and 225 is completed. A semiconductor device of the present invention includes in the category the thin film integrated circuit 223 sealed between the base substances 224 and 225 as mentioned above. Note that the base substances 224 and 225 each correspond to a substrate formed of an organic resin (for example, a plastic substrate) or a film (for example, a film formed of polypropylene, polyester, vinyl, polyvinyl fluoride, polyvinyl chloride, or the like).

In addition, when a semiconductor device of the present invention is implanted in a human body, a protective layer 230 is preferably provided so as to cover the base substances 224 and 225 in order not to exert a harmful influence on a human body. The protective layer 230 is formed of a material that does not exert a harmful influence on a human body, specifically, an insulating layer of silicon oxide, silicon nitride, silicon oxynitride, titanium (Ti), diamond-like carbon (DLC), carbon nitride, or the like. Note that the DLC herein also contains a hydrogenated amorphous carbon film and the like.

Figure 6A:
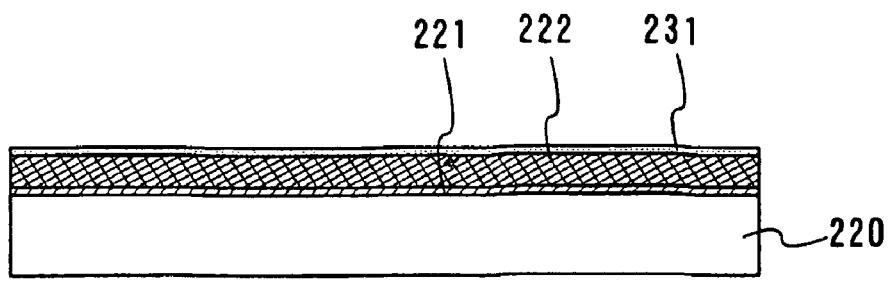
FIGS. 6A to 6D are views each showing one example of a semiconductor device according to the present invention.
Figure 6B:
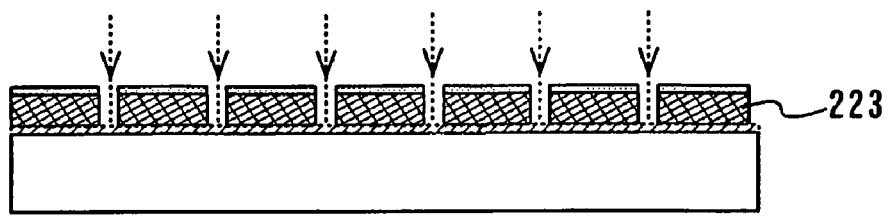
Figure 6C:
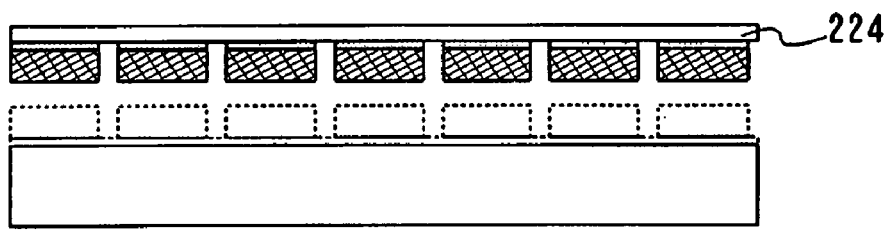
Figure 6D:
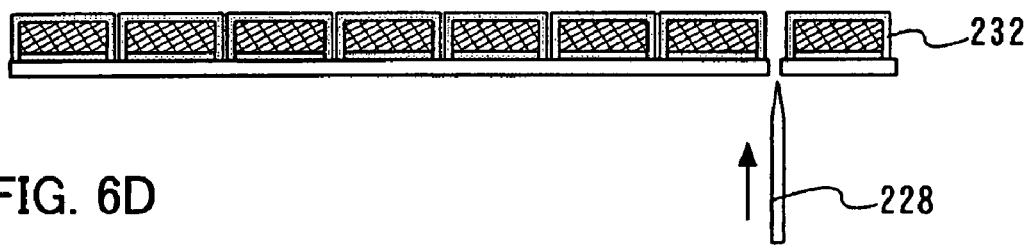

Next, a procedure of peeling the plurality of elements from the substrate 216 which is different from the above will be explained with reference to FIGS. 6A to 6D. First, a peeling layer 221, a layer 222 including a plurality of thin film integrated circuits, and a protective layer 231 are formed over a substrate 220 (FIG. 6A). Next, an opening is formed selectively in the protective layer 231 and the layer 222 including a plurality of thin film integrated circuits to expose the peeling layer 221 (FIG. 6B). Thereafter, the layer 222 including a plurality of thin film integrated circuits is peeled from the substrate 220 with the use of the method shown in the above FIGS. 5A to 5E. Herein, as well as removing the peeling layer 221 by introducing the etchant to the opening provided in the layer 222 including a plurality of thin film integrated circuits and the protective layer 231, the layer 222 including a plurality of thin film integrated circuits is divided to form a plurality of thin film integrated circuits 223. Then, one side of the thin film integrated circuit 223 is attached to a base substance 224 to peel the thin film integrated circuit 223 from the substrate 220 (FIG. 6C). Subsequently, a protective layer 232 is formed over a side where the thin film integrated circuit 223 is exposed (FIG. 6D). Accordingly, the thin film integrated circuit 223 covered with the protective layer 232 is completed. Subsequently, the base substance 224 is cut by a cutting means 228. Accordingly, the thin film integrated circuit 223 covered with the protective layers 231 and 232 is completed. Note that part of the protective layers is removed selectively to provide an opening and to expose a detecting element, depending on physical quantity or chemical quantity to be detected.

In a semiconductor device shown in this embodiment mode, it becomes possible to detect various physical quantity or chemical quantity and to display and control the information to an external device without being contacted therewith. In addition, the surface of a semiconductor device according to the present invention is covered with a protective layer such as DLC; therefore, there is no fear of exerting a harmful influence when the semiconductor device is provided by being implanted in a human body.

(Embodiment Mode 2)

In this embodiment mode, a structure of the detecting element shown in the above embodiment mode will be explained with reference to drawings.

Figure 7A:
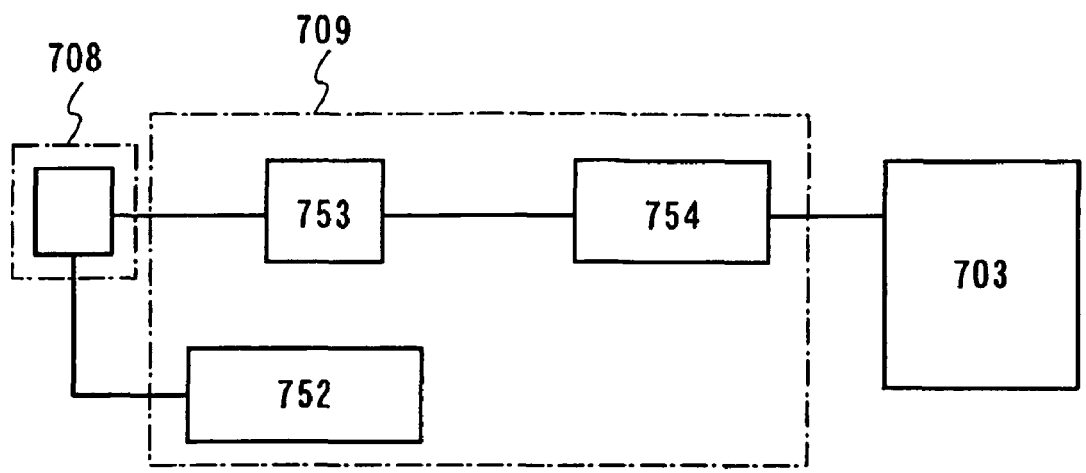
FIGS. 7A and 7B are diagrams each showing one example of a semiconductor device according to the present invention.
Figure 7B:
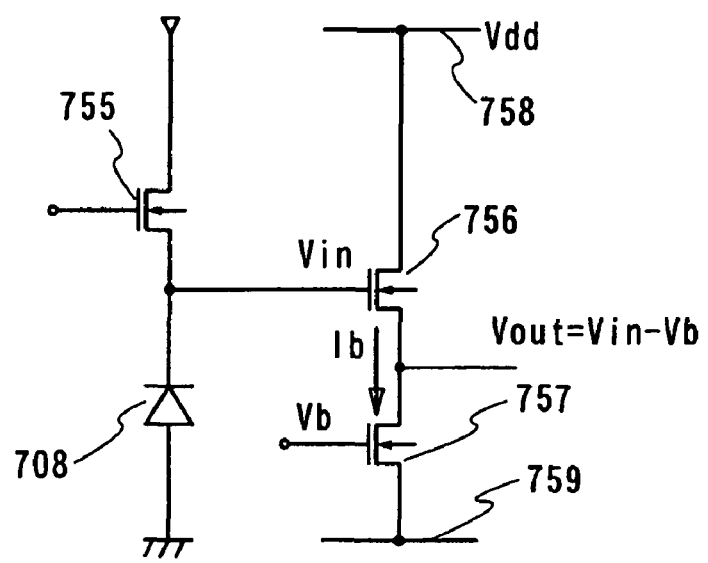

FIGS. 7A and 7B each show one example of a detecting unit for detecting ambient brightness or light irradiation. A detecting element 708 is formed of a photodiode, a phototransistor, or the like. A detection control circuit 709 has a detection driver circuit 752, a detection circuit 753, and an A/D conversion circuit 754 (FIG. 7A). Hereinafter, the detection circuit 753 will be explained with reference to FIG. 7B.

When a reset TFT 755 is made into a conductive state, the detecting element 708 is applied with a reverse bias voltage. Here, an operation of being potential at a negative terminal of the detecting element 708 charged to potential of power supply voltage is referred to as "reset." Thereafter, the reset TFT 755 is made into a non-conductive state. At this time, a potential state is changed with time due to electromotive force of the detecting element 708. In other words, the potential of a negative terminal of the detecting element 708 charged to the potential of power supply voltage is gradually decreased due to charge generated by photoelectric conversion.

After a certain period of time, a signal is outputted to an output side passing through an amplification TFT 756 when a bias TFT 757 is made into a conductive state. In this case, the amplification TFT 756 and the bias TFT 757 serve as so-called source follower circuits. Although an example of forming the source follower circuit by an n-channel TFT is herein shown, the source follower circuit can be formed of a p-channel TFT, of course.

An amplification power supply line 758 is added with a power supply voltage Vdd. A bias power supply line 759 is applied with a reference potential of 0 volt. A drain terminal of the amplification TFT 756 is connected to the amplification power supply line, whereas a source terminal is connected to a drain terminal of the bias TFT 757. A source terminal of the bias TFT 757 is connected to a bias power supply line 759. A gate terminal of the bias TFT 757 is applied with a bias voltage Vb, and a bias current Ib flows through the TFF. The bias TFT 757 basically serves as a constant current source. A gate terminal of the amplification TFT 756 is added with an input voltage Vin, and a source terminal serves as an output terminal. The source follower circuit has an input and output relationship of Vout=Vin−Vb. The output voltage Vout is converted to a digital signal by the A/D conversion circuit 754. The digital signal is outputted to an arithmetic processing circuit 703.

Figure 8:
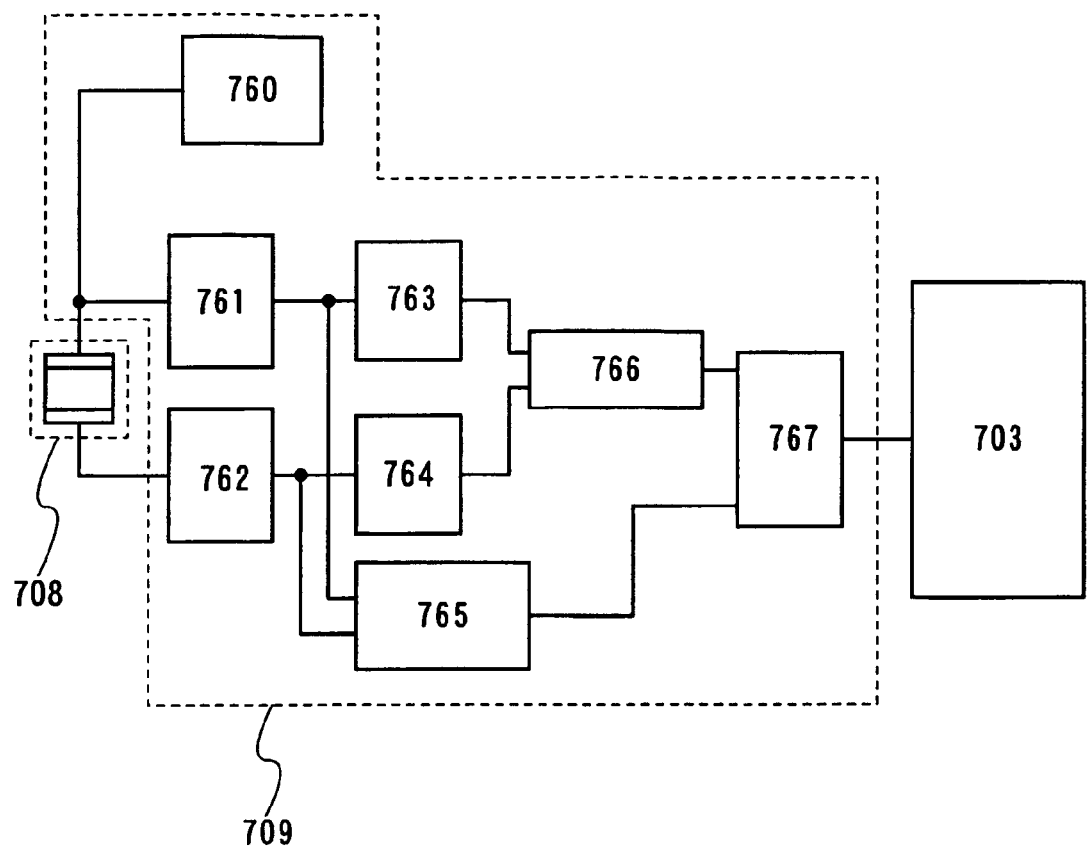
FIG. 8 is a diagram showing one example of a semiconductor device according to the present invention.

FIG. 8 shows one example of providing an element for detecting electrostatic capacity to the detecting element. The element for detecting electrostatic capacity has a pair of electrodes. An object for detecting liquid or gas is filled between the pair of electrodes. By detecting the change in electrostatic capacity between the pair of electrodes, for example, the state of contents sealed in a container is judged. In addition, change in humidity can also be detected by reading out minute change of electrical resistance with polyimide, acrylic, or a hygroscopic dielectric material interposed between the pair of electrodes.

The detection control circuit 709 has the following structure. An oscillation circuit 760 generates a reference signal for measurement to input the signal to an electrode of the detecting element 708. Voltage at this time is also inputted to a voltage detection circuit 761. A reference signal detected by the voltage detection circuit 761 is converted into a voltage signal which shows an effective value by a conversion circuit 763. Current flowing between electrodes of the detecting element 708 is detected by a current detection circuit 762. A signal detected by the current detection circuit 762 is converted into a current signal which shows effective value by a conversion circuit 764. An arithmetic circuit 766 calculates an electric parameter such as impedance or admittance by arithmetic processing of the voltage signal which is output of the conversion circuit 763 and the current signal which is output of the conversion circuit 764. Output of the voltage detection circuit 761 and output of the current detection circuit 762 are inputted to a phase comparator circuit 765. The phase comparator circuit 765 outputs the phase difference between both of the signals to an arithmetic circuit 767. The arithmetic circuit 767 calculates electrostatic capacity by using output signals of the arithmetic circuit 766 and the phase comparator circuit 765. Then, the signals are outputted to the arithmetic processing circuit 703.

FIGS. 14A and 14B and FIGS. 15A to 15E each show an equivalent circuit of a detecting element for detecting temperature and the operation.

Figure 14A:
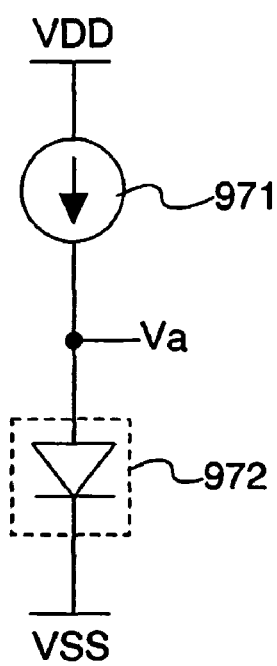
FIGS. 14A and 14B are a diagram and a graph each showing one example of a semiconductor device according to the present invention.
Figure 14B:
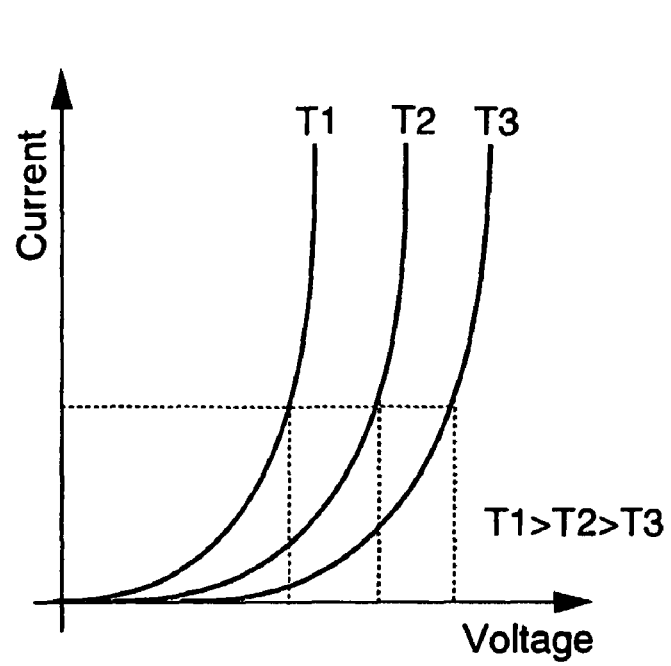

First, the case of using an element including a layer containing an organic compound between a pair of conductive layers as a detecting element for detecting temperature will be explained with reference to FIGS. 14A and 14B.

A detecting element 971 for detecting temperature and a constant current source 972 are connected serially, and one terminal of the detecting element 971 is connected to a high-potential power supply with a constant potential (VDD). In addition, one terminal of the constant current source 972 is connected to a low-potential power supply with a constant potential (VSS) (FIG. 14A). The detecting element 971 has a property that the resistance value is changed in accordance with the ambient temperature. Specifically, with room temperature set as a normal temperature, when the temperature becomes higher than the normal temperature, the resistance value decreases while the resistance value increases when the temperature becomes lower than the normal temperature. Such a property of the detecting element 971 is as shown in a graph of FIG. 14B that shows a relationship between voltage-current characteristics of the detecting element 971 and temperature.

The detecting element 971 is supplied with a constant current by the constant current source 972. The resistance value of the detecting element 971 is changed with change in the ambient temperature in this state. Then, the potential (to be Va) of the other node of the detecting element 971 is changed with change in the resistance value of the detecting element 971. The ambient temperature can be detected by reading out such potential Va of the other node of the detecting element 971.

Next, the case of using one or a plurality of transistors as a detecting element for detecting temperature will be explained with reference to FIGS. 15A to 15E.

Figure 15A:
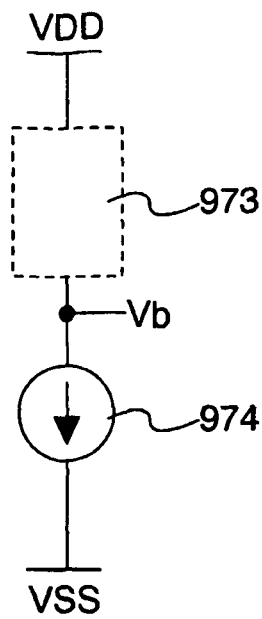
FIGS. 15A to 15E are diagrams and a graph each showing one example of a semiconductor device according to the present invention.

A detecting element 973 formed of one or a plurality of transistors and a constant current source 974 are connected serially, and one terminal of the detecting element 973 is connected to a high-potential power supply with a constant potential (VDD) (FIG. 15A). In addition, one terminal of the constant current source 974 is connected to a low-potential power supply with a constant potential (VSS).

Figure 15B:
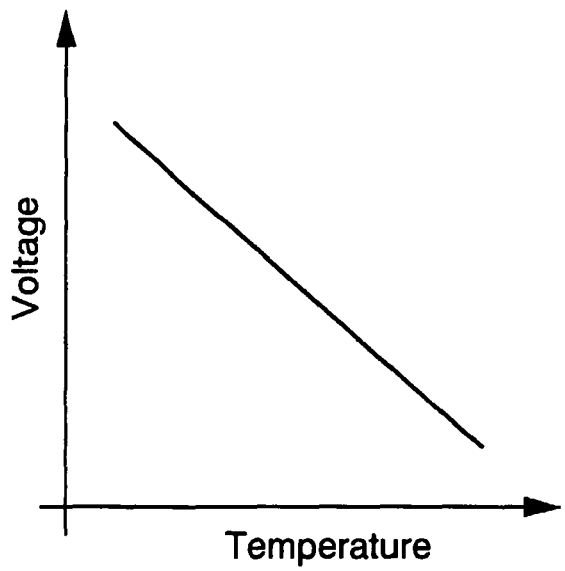

The detecting element 973 has a property that the resistance value is changed in accordance with the ambient temperature. The potential (to be Vb) of the other node of the detecting element 973 is changed with change in resistance value of the detecting element 973. The ambient temperature can be detected by reading out such potential Vb of the other node of the detecting element 973. A potential Vb of the node of the detecting element 973 and a temperature shows an almost linear relationship (FIG. 15B).

Figure 15C:
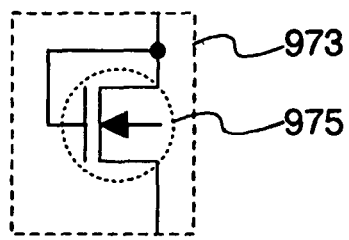
Figure 15D:
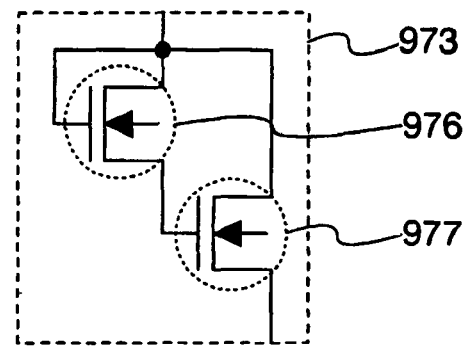
Figure 15E:
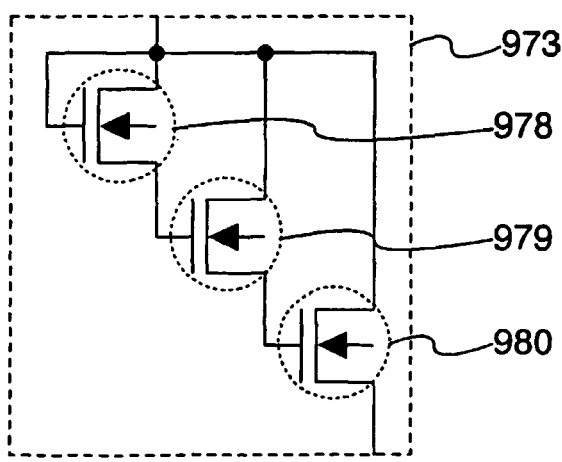

Note that any one of the cases of the detecting element 973 such as the following may be employed in the present invention: the case containing one transistor 975; the case containing two transistors 976 and 977; or the case containing three transistors 978 to 980 (FIGS. 15C to 15E).

In addition, when a transistor is used as the detecting element for detecting temperature, a transistor in the detecting element has a preferably different structure from that of a transistor in a detection control circuit, an arithmetic processing circuit, or the like. The transistor in the detecting element has a structure where the characteristic of the transistor is easily changed due to temperature change, whereas a transistor used for the other circuit such as the detection control circuit or the arithmetic processing circuit has a structure where the characteristic is not changed even when there is temperature change. Specifically, compared with the transistor in the detecting element, a channel length (a length of a semiconductor film between a source region and a drain region) of a semiconductor film in the transistor of the detection control circuit or the arithmetic processing circuit is set longer; therefore, an influence on temperature change can be reduced. Moreover, it is also possible to relieve the influence on temperature change by changing a channel width (in a direction perpendicular to a channel length) of a transistor.

Figure 9:
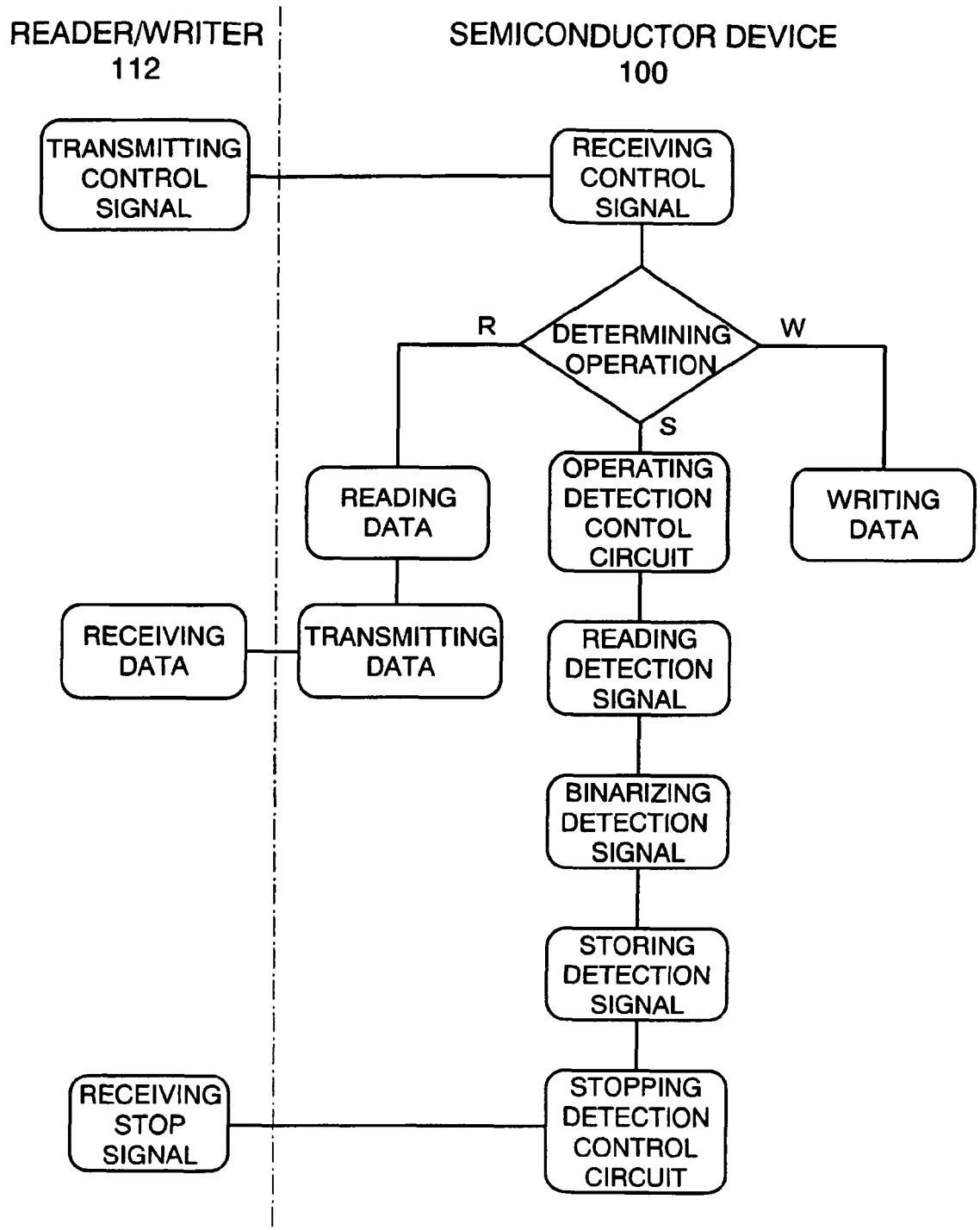
FIG. 9 is a diagram showing one example of a semiconductor device according to the present invention.

Next, an explanatory flow chart for showing operation of a reader/writer 112 and a semiconductor device 100 is shown in FIG. 9.

The reader/writer 112 transmits control signals such as a detection seizing signal, a data read out signal, or a data writing signal. The semiconductor device 100 receives the control signals. The semiconductor device 100 identifies the control signals by an arithmetic processing circuit. Then, a detecting unit is operated to determine which operation will be performed among operation of measuring data and recording data to a storage unit, operation of reading out data stored in a storage unit, and operation of writing data into the storage unit. As for the operation of measuring data and recording data to the storage unit, first, a detection control circuit is operated, a signal of a detecting element is read out, the signal is binarized via the detection control circuit, and the signal is stored to the storage unit via the arithmetic processing circuit. After the storage of the signal, the detection control circuit is stopped, and a stop signal is transmitted. The reader/writer 112 receives the stop signal. As for the operation of writing data from the reader/writer 112, data sent from the reader/writer 112 is written into the storage unit. As for the operation of reading out data stored in the storage unit, a reading control circuit is operated, data stored in a storage element is read out, and the data is transmitted. The reader/writer 112 receives the data. Electrical power required for the operation of the circuit is supplied simultaneously with transmitting the signal or as needed.

Figure 10:
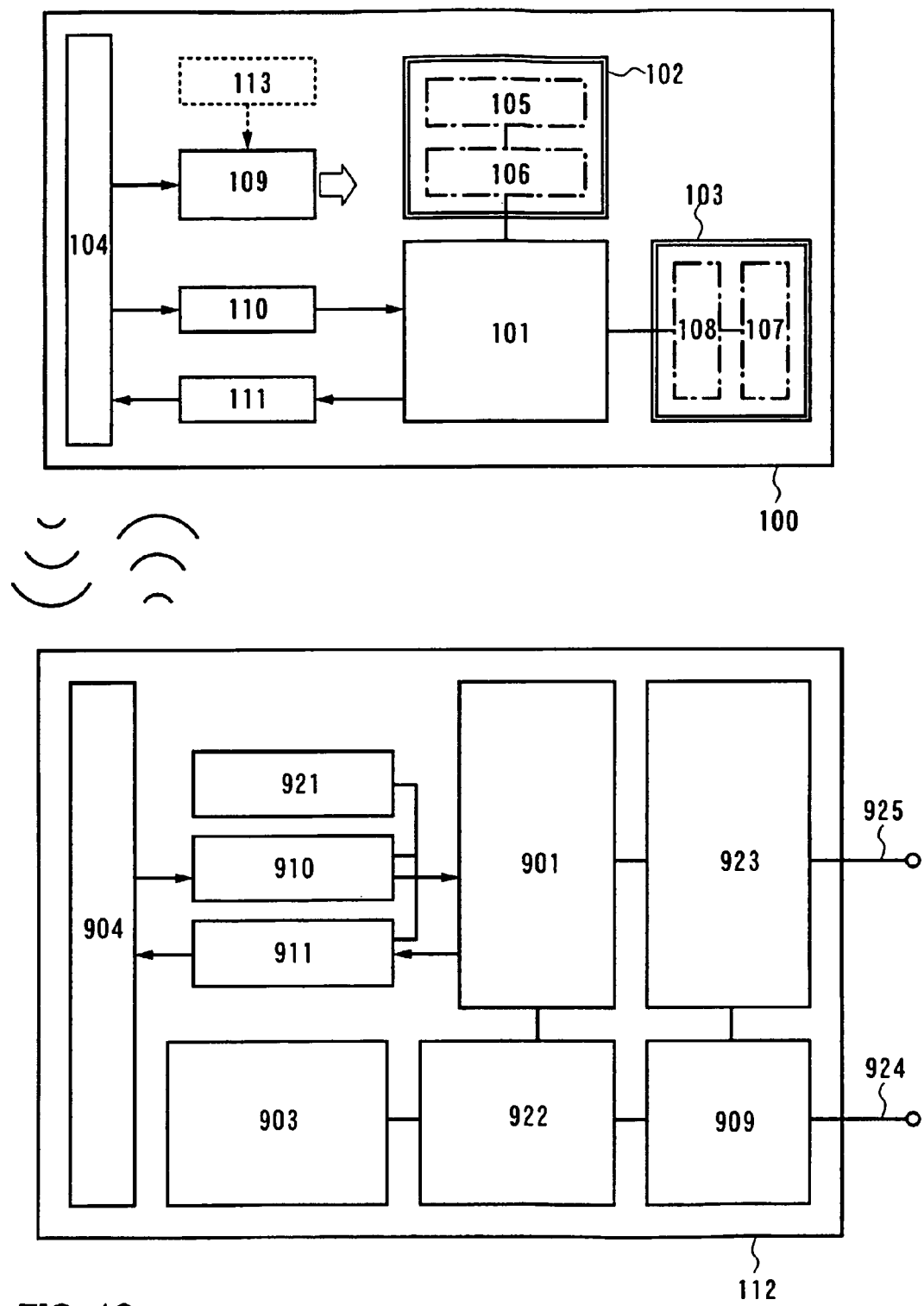
FIG. 10 is a diagram showing one example of a semiconductor device according to the present invention.

Then, a system of transmitting and receiving data detected by the detecting element provided to the semiconductor device with the reader/writer will be explained with reference to FIG. 10. FIG. 10 shows one example of the above semiconductor device 100 and the reader/writer 112 which transmits and receives information on the semiconductor device 100. The reader/writer 112 includes an antenna 904, a transmitter 921, a demodulation circuit 910, and a modulation circuit 911. Besides, the reader/writer 112 includes an arithmetic processing circuit 901 and an external interface unit 923. In order to transmit and receive an encrypted control signal, an encryption and decryption circuit unit 922 and a storage unit 903 may be provided to the reader/writer 112. A power supply circuit unit 909 is a circuit unit which supplies electric power to each circuit. The power supply circuit unit 909 supplies electric power supplied from an external power supply 924 to each circuit.

Information detected by a detecting unit 102 in the semiconductor device 100 is processed by an arithmetic processing circuit 101 and then stored in a storage unit 103. A signal sent as an electronic wave via the conversion circuit 911 of the reader/writer 112 is converted into an AC electric signal by electromagnetic induction in an antenna 104 of the semiconductor device 100. The AC electric signal is demodulated in a demodulation circuit 110 to be sent to the arithmetic processing circuit 101. The arithmetic processing circuit 101 calls up data retained in the storage unit 103 according to the input signal. Then, the signal is sent to a modulation circuit 111 from the arithmetic processing circuit 101 to modulate the signal into an AC electric signal by the modulation circuit 111. The AC electric signal is sent to the antenna 904 in the reader/writer 112 via the antenna 104.

The AC signal received in the antenna 904 in the reader/writer 112 is demodulated by the demodulation circuit 910 to be sent to the arithmetic processing circuit 901 and the external interface unit 923 on the subsequent stage. Then, the data detected by the detecting unit 102 is displayed on an information processing device 925 such as a display or a computer connected to the external interface unit 923

Note that this embodiment mode can be arbitrarily combined with the above embodiment mode.

(Embodiment Mode 3)

A semiconductor device of the present invention can detect various physical quantity or chemical quantity as shown in the above embodiment mode. Therefore, diverse information such as information on a living body or a health condition can be recognized anywhere easily by making human beings, animals, or the like carry the above semiconductor device. In addition, as for a method for carrying a semiconductor device, in the case of human beings for example, a method for providing a semiconductor device such as by being attached to the surface of the body or by being implanted in the body of human beings can be considered. However, a semiconductor device may be provided by being appropriately selected by an individual in consideration of physical quantity or chemical quantity to be detected. Hereinafter, specific examples of usage patterns of a semiconductor device according to the present invention will be explained with reference to drawings.

Figure 11A:
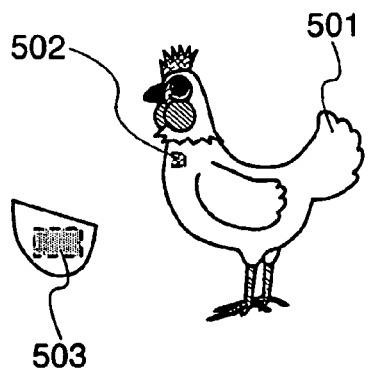
FIGS. 11A to 11F are views each showing one example of a usage pattern of a semiconductor device according to the present invention.

A semiconductor device 502 including an element for detecting temperature is implanted in an animal 501, and a feeder or the like provided in vicinity of the animal 501 is provided with a reader/writer 503 (FIG. 11A). Then, a health condition of the animal 501 can be monitored and managed by regularly reading out information such as body temperature of the animal 501 that is detected by the semiconductor device 502 with the use of the reader/writer 503. In this case, it is possible to manage a plurality of animals simultaneously by making the semiconductor device 502 store identification numbers in advance. In particular, when the semiconductor device 502 is implanted in the animal 501, it is preferable to provide the semiconductor device 502 to be decreased in size by being formed using a TFT or the like. In addition, as shown in the above embodiment mode, even when stress is applied to the implanted semiconductor device 502, the semiconductor device can be prevented from being damaged by being provided to have flexibility.

Figure 11B:
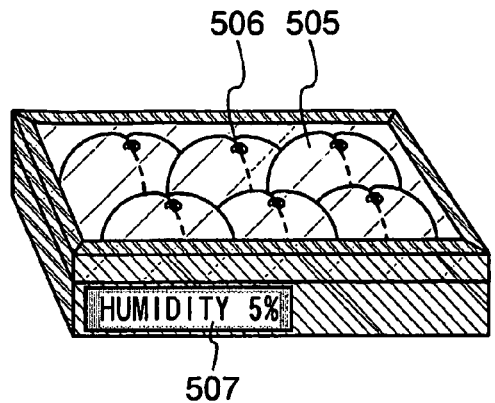

In addition, a semiconductor device 506 including an element for detecting a gas component of gas or the like is provided to a food 505, and a wrapping paper or a display shelf is provided with a reader/writer 507 (FIG. 11B). Then, freshness of the food 505 can be managed by regularly reading out information that is detected by the semiconductor device 506 with the use of the reader/writer 507.

Figure 11C:
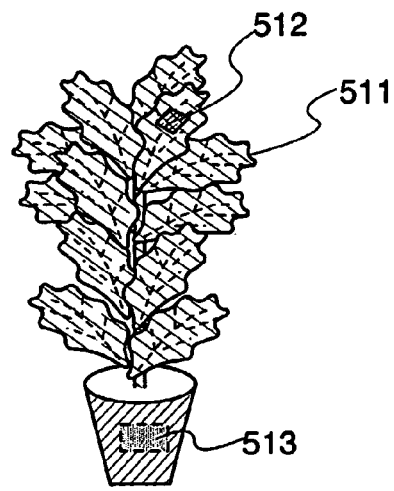

In addition, a semiconductor device 512 including an element for detecting light is provided to a plant 511, and a flowerpot or the like of the plant 511 is provided with a reader/writer 513 (FIG. 11C). Then, as well as information on duration of sunshine can be obtained, information on the time when a flower should bloom and the shipping time of the flower can be predicted accurately by regularly reading out information that is detected by the semiconductor device 512 with the use of the reader/writer 513. In particular, in the semiconductor device 512 including an element for detecting light, it is possible to supply the semiconductor device 512 with electric power by external light along with electric power supplied by an electromagnetic wave from the reader/writer 513 by simultaneously providing the semiconductor device with a solar battery. The solar battery may be provided along with the detecting element or may be provided separately from the detecting element.

Figure 11D:
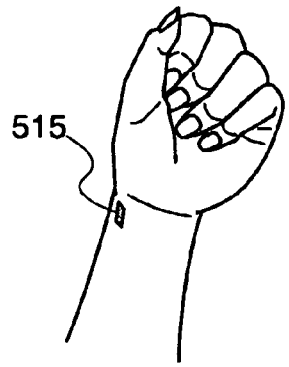

In addition, a semiconductor device 515 including an element for detecting pressure is provided by being attached to an arm of a human body or implanted therein (FIG. 11D). Then, information on blood pressure, pulse, or the like can be obtained by reading out information that is detected by the semiconductor device 515 with the use of a reader/writer. In particular, when the semiconductor device 515 is provided by being attached to an arm of a human body or implanted therein, it is preferable to provide the semiconductor device 515 to be decreased in size by being formed using a TFT or the like. In addition, as shown in the above embodiment mode, even when stress is applied to the attached or implanted semiconductor device 515, the semiconductor device can be prevented from being damaged by being provided to have flexibility.

Figure 11E:
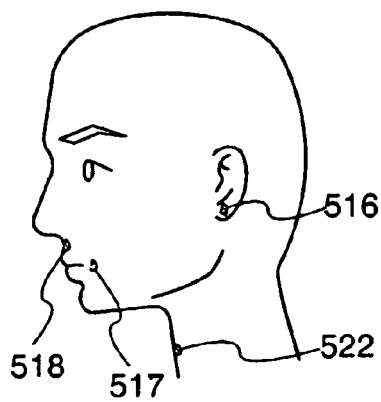

In addition, a semiconductor device 516 including an element for detecting temperature is implanted in an earlobe (FIG. 11E). Then, information on body temperature can be obtained by reading out information that is detected by the semiconductor device 516 with the use of a reader/writer.

In addition, body temperature measured in a comfortable condition is referred to as basal body temperature, which has a constant rhythm, and a physical condition of oneself can be grasped according to a result of a measurement. Basal body temperature needs to be measured in a motionless state when awaked, and it is preferable to be measured under a tongue for 5 minutes. In other words, in measuring basal body temperature, there is intricacy that a basal thermometer is put in a mouth everyday to measure basal body temperature as well as keeping the basal thermometer clean. However, there is no need to use a basal thermometer when a semiconductor device 517 of the present invention is implanted in a tongue or the like; thus, body temperature can be measured by holding a reader/writer over the mouth every day (FIG. 11E).

In addition, a semiconductor device 518 including an element for detecting pressure is provided by being attached under a nose or implanted therein (FIG. 11E). Then, information on breath can be obtained by reading out information that is detected by the semiconductor device 518 with the use of a reader/writer. This is effective particularly when the conditions of many patients are desired to be known in a hospital or the like.

In addition, a semiconductor device 522 including an element for detecting oscillation is provided by being attached to a throat or implanted therein (FIG. 11E). Then, information on oscillation of a vocal cord in the throat can be obtained by reading out information that is detected by the semiconductor device 522 with the use of a reader/writer. This is effective particularly when one's will to utter a voice is expressed by detecting oscillation of a vocal cord even when the voice cannot be uttered due to illness or the like.

Figure 11F:
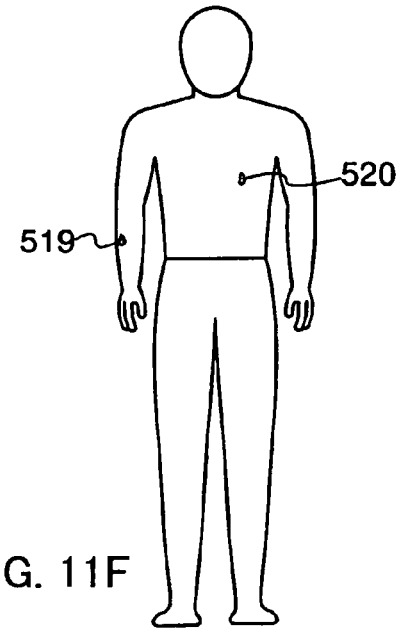

In addition, a semiconductor device 519 including a detecting element for detecting a ultra-violet ray is provided by being attached to a place where light transmits or implanted therein (FIG. 11F). Accordingly, without carrying a special sensor, a ultra-violet ray can be measured by holding a reader/writer over the semiconductor device 519 at a preferable place when needed. A ultra-violet ray cannot be sensed by human beings and exerts a harmful influence on skin or an eye and decreases an immune strength; however, a self-defense means can be taken immediately by measuring a ultra-violet ray.

Figure 12:
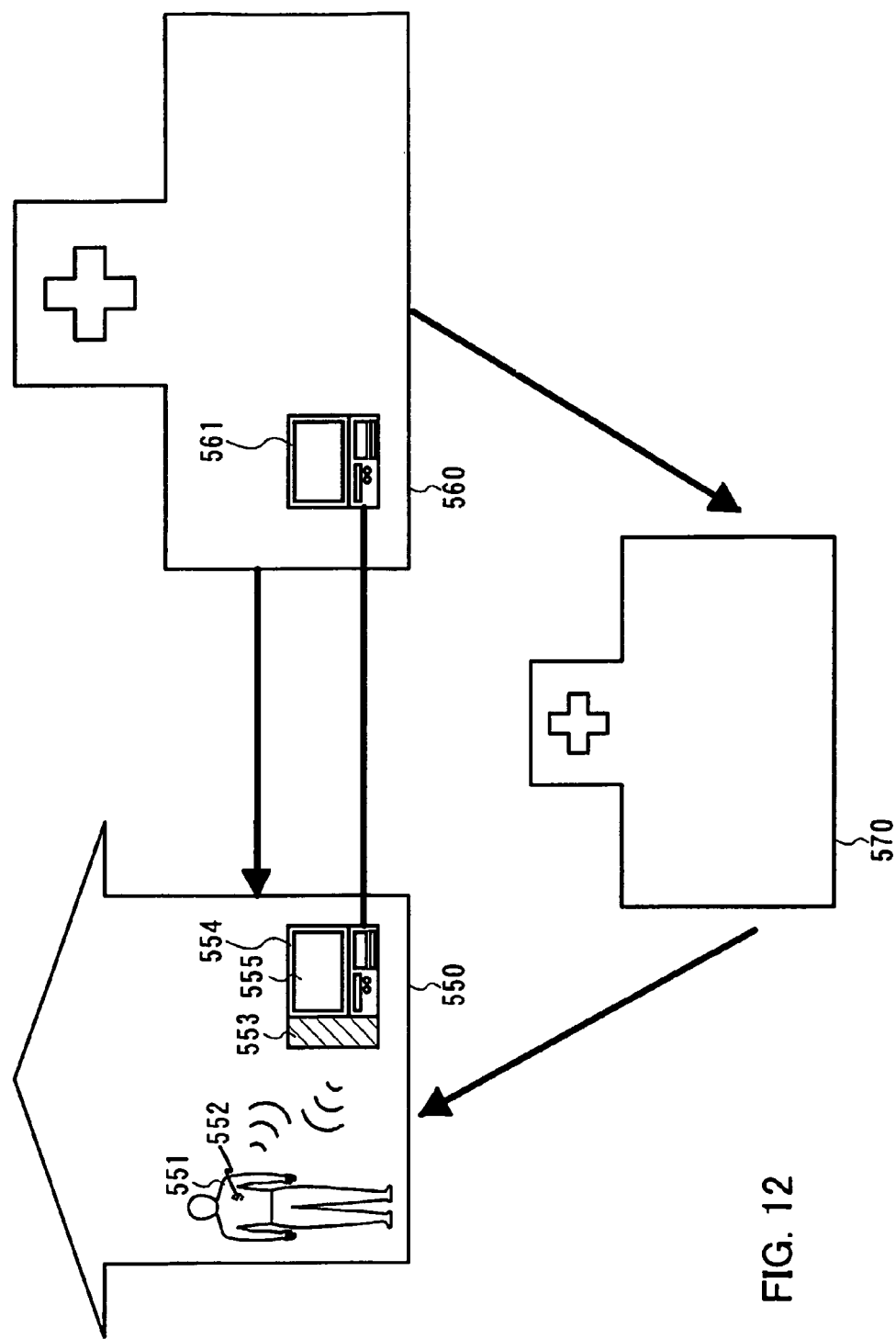
FIG. 12 is a view showing one example of a usage pattern of a semiconductor device according to the present invention.

In addition, in addition to the above, a semiconductor device 520 including an element for detecting pressure may be attached in vicinity of a heart to measure a heart rate. As mentioned above, a semiconductor device of the present invention can be utilized in health care of a human body or prevention and a forecast of diseases. Moreover, a semiconductor device of the present invention can be utilized in a monitoring system for home-care or the like by obtaining information on a living body that is read out by a reader/writer with the use of a network such as Internet. The specific example is shown in FIG. 12.

An individual 551 is made to carry a semiconductor device 552 that can detect physical quantity or chemical quantity. As shown in FIGS. 11A to 11F, the semiconductor device 552 may be provided by being attached to a human body or implanted therein so that the individual 551 is appropriately selected to be provided. In addition, since blood, pulse, or the like is different among individuals, the semiconductor device 552 is provided in accordance with the individual 551. Accordingly, by making the individual 551 to carry the semiconductor device 552, information on a living body can be displayed in a display portion 555 of a device 554 such as a computer by reading out the information on a living body of the individual 551 that is detected by the semiconductor device 552 with a reader/writer 553. Further, the information on a living body that is read out can be transmitted from a home 550 to a medical institution 560 at a real time by using a network such as Internet.

The medical institution 560 monitors and manages information on the individual 551 by receiving the transmitted data by a device 561 such as a computer. In addition, a primary doctor and/or a medical specialist of the individual 551 can diagnose the individual 551 based on the transmitted information.

Accordingly, since the change in physical quantity or chemical quantity regarding a health condition of the individual 551 is detected regularly and transmitted to the medical institution 560, the medical institution 560 can monitor the health condition of the individual 551 even staying at home 550. Therefore, when any abnormality is found for the individual 551, it is possible to perform a detailed examination by dispatching a doctor immediately.

In addition, when the individual 551 always carries the semiconductor device 552, a health condition of the individual 551 can be grasped constantly even when the individual is away from home. Moreover, when any abnormality is found for the individual 551, a doctor can be dispatched to the individual 551 immediately to offer treatment by exchanging information between the medical institution 560 where information on a living body of the individual 551 is managed and a medical institution 570 in vicinity of the individual 551. This is effective particularly when the individual 551 is out and when abnormality is found at the place except a home.

In addition, it is also possible to improve one lacked in the individual 551 by managing the information on a living body of the individual 551 regularly. For example, when the present individual 551 lacks vitamin, this can be displayed in the display portion 555 to call attention and a foodstuff or the like to be taken in can also be displayed by managing and analyzing the information on a living body of the individual 551 by the device 554 such as a computer.

As mentioned above, a health condition of the individual can be grasped not only by oneself but also by a medical institution or the like by making the individual always carry the semiconductor device 552 of the present invention; thus, it is possible to prevent illness or the like and to provide the best treatment immediately even when an accidental disease or an accident occurs.

Note that this embodiment mode can be arbitrarily combined with the above embodiment modes.

The invention claimed is:

1. A semiconductor device comprising:
 an element at least having a first transistor, a second transistor, and a third transistor, each of which is provided over a substrate;
 a detecting element provided over the element, electrically connected to the first transistor;
 a storage element provided over the element, electrically connected to the second transistor; and
 a first conductive layer for an antenna provided over the element, electrically connected to the third transistor,
 wherein the storage element comprises:
  a second conductive layer provided over the element;
  a third conductive layer provided adjacent to the second conductive layer; and
  an organic compound layer provided between the second conductive layer and the third conductive layer, and
 wherein the substrate, the element, the detecting element, the storage element, and the first conductive layer are covered with a protective layer.

2. The semiconductor device according to claim 1, wherein the first conductive layer and the second conductive layer are provided in the same layer.

3. The semiconductor device according to claim 1, wherein the detecting element comprises:
 a first layer provided over the element;
 a second layer provided adjacent to the first layer; and
 a third layer provided between the first layer and the second layer,
 wherein the first layer is a P-type semiconductor layer,
 wherein the second layer is an N-type semiconductor layer, and
 wherein the third layer is an I-type semiconductor layer.

4. The semiconductor device according to claim 3, wherein the first layer and the first conductive layer are provided in the same layer.

5. A semiconductor device according to claim 3, wherein the first layer and the second conductive layer are provided in the same layer.

6. The semiconductor device according to claim 1, wherein the detecting element comprises:
 a first layer provided over the element;
 a second layer provided adjacent to the first layer; and
 a third layer provided between the first layer and the second layer,
 wherein the first layer is a fourth conductive layer,
 wherein the second layer is a semiconductor layer, and
 wherein the third layer is a compound semiconductor layer.

7. The semiconductor device according to claim 1, wherein the detecting element comprises:
 a first layer provided over the element;
 a second layer provided adjacent to the first layer; and
 a third layer provided between the first layer and the second layer,
 wherein the first layer is a fourth conductive layer,
 wherein the second layer is a fifth conductive layer, and
 wherein the third layer is a piezoelectric layer.

8. The semiconductor device according to claim 1, wherein the detecting element comprises:
 a first layer provided over the element;
 a second layer provided adjacent to the first layer; and
 a third layer provided between the first layer and the second layer,
 wherein the first layer is a fourth conductive layer,
 wherein the second layer is a fifth conductive layer, and
 wherein the third layer is a hygroscopic layer.

9. The semiconductor device according to claim 8, wherein the fourth conductive layer and the fifth conductive layer are provided in the same layer.

10. The semiconductor device according to claim 1, wherein the detecting element comprises:
 a first layer provided over the element;
 a second layer provided adjacent to the first layer; and
 a third layer provided between the first layer and the second layer,
 wherein the first layer is a fourth conductive layer,
 wherein the second layer is a fifth conductive layer, and
 wherein the third layer is an organic compound layer.

11. The semiconductor device according to claim 10, wherein the fourth conductive layer and the fifth conductive layer are provided in the same layer.

12. The semiconductor device according to claim 1, wherein the detecting element comprises:
 a first layer provided over the element; and
 a second layer provided adjacent to the first layer,
 wherein the first layer is a fourth conductive layer, and
 wherein the second layer is a response layer.

13. The semiconductor device according to claim 1, wherein the detecting element comprises:
 a first layer provided over the element;
 a second layer provided adjacent to the first layer; and
 a third layer provided between the first layer and the second layer,
 wherein the first layer is a fourth conductive layer,
 wherein the second layer is a fifth conductive layer, and
 wherein the third layer is a layer where an enzyme, a protein, DNA, an antibody molecule, or a microorganism cell is immobilized to a base substance.

14. The semiconductor device according to claim 13, wherein the fourth conductive layer and the fifth conductive layer are provided in the same layer.

15. The semiconductor device according to claim 13, wherein the base substance is a high molecular weight film.

16. A semiconductor device according to claim 1, wherein the protective layer is one selected from the group consisting of silicon oxide, silicon nitride, silicon oxynitride, diamond-like carbon and carbon nitride.

17. A semiconductor device according to claim 1, wherein the substrate is any one of a glass substrate and a substrate having flexibility.

* * * * *